US009460935B2

(12) United States Patent
Chung

(10) Patent No.: US 9,460,935 B2
(45) Date of Patent: Oct. 4, 2016

(54) METHOD FOR FABRICATING SEMICONDUCTOR DEVICES

(71) Applicant: Samsung Electronics Co., Ltd., Suwon-si, Gyeonggi-do (KR)

(72) Inventor: Wonwoong Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/840,835

(22) Filed: Aug. 31, 2015

(65) Prior Publication Data
US 2016/0118266 A1 Apr. 28, 2016

(30) Foreign Application Priority Data

Oct. 24, 2014 (KR) .................. 10-2014-0145352

(51) Int. Cl.
*H01L 21/336* (2006.01)
*H01L 21/311* (2006.01)
*H01L 21/02* (2006.01)
*H01L 21/768* (2006.01)
(Continued)

(52) U.S. Cl.
CPC .......... *H01L 21/31116* (2013.01); *C09K 13/00* (2013.01); *H01L 21/0214* (2013.01); *H01L 21/0217* (2013.01); *H01L 21/02164* (2013.01); *H01L 21/31144* (2013.01); *H01L 21/76805* (2013.01); *H01L 29/4236* (2013.01)

(58) Field of Classification Search
CPC ..................... H01L 21/31116; H01L 21/0214; H01L 21/02164; H01L 21/0217; H01L 21/31144; H01L 21/76805; H01L 29/4236

USPC ................ 438/294, 297, 710, 718, 723, 724
See application file for complete search history.

(56) References Cited

U.S. PATENT DOCUMENTS 6,183,655 B1 * 2/2001 Wang ................ H01L 21/31116
216/68
6,228,774 B1 5/2001 Marquez
6,613,691 B1 9/2003 Hung et al.
(Continued)

FOREIGN PATENT DOCUMENTS

JP 2002533951 A 10/2002
JP 2006165164 A 6/2006
(Continued)

OTHER PUBLICATIONS

Ito et al. "Hydrogen Effects in Hydrofluorocarbon Plasma Etching of Silicon Nitride: Beam Study with $CF^+$, $CF^-_2$, $CHF^+_2$, and $CH_2F^+$ Ions", J. Vac. Sci. Technol. A 29(5), Sep./Oct. 2011, 4 pages.

*Primary Examiner* — Kevin M Picardat
(74) *Attorney, Agent, or Firm* — Myers Bigel & Sibley, P.A.

(57) ABSTRACT

The invention relates to a method for fabricating a semiconductor device. The method comprises forming a first etching layer and a second etching layer stacked on a substrate, and forming a recess region by etching the first and second etching layers under plasma generated from an etching gas including a compound. The compound comprises at least one of 1,1,1,2,3,3-hexafluoropropane, 2,2,2-trifluoroethane-1-thiol, 1,1,1,3,3-pentafluoropropane, 1,1,2,2,3-pentafluoropropane and 1,1,2,2-tetrafluoro-1-iodoethane, 2,3,3,3-tetrafluoropropene and 1,1-difluoroethene.

20 Claims, 31 Drawing Sheets

(51) Int. Cl.
   *C09K 13/00*   (2006.01)
   *H01L 29/423*  (2006.01)

(56) References Cited

U.S. PATENT DOCUMENTS

| | | | |
|---|---|---|---|
| 6,746,961 B2 | 6/2004 | Ni et al. | |
| 7,547,635 B2 | 6/2009 | Eppler et al. | |
| 7,618,548 B2 | 11/2009 | Chinn et al. | |
| 7,645,707 B2 | 1/2010 | Rusu et al. | |
| 8,242,494 B2 * | 8/2012 | Suzawa | H01L 27/1225 257/43 |
| 8,614,151 B2 | 12/2013 | Benson et al. | |
| 9,017,571 B2 * | 4/2015 | Umezaki | H01L 21/31116 216/58 |
| 2006/0046469 A1 * | 3/2006 | Shim | H01L 21/31116 438/637 |
| 2006/0118519 A1 | 6/2006 | Delgadino et al. | |
| 2008/0023144 A1 | 1/2008 | Delgadino et al. | |
| 2008/0093338 A1 | 4/2008 | Okune et al. | |
| 2009/0047789 A1 | 2/2009 | Jung | |
| 2011/0053379 A1 | 3/2011 | Chi et al. | |
| 2014/0242803 A1 * | 8/2014 | Hibino | C09K 13/00 438/724 |
| 2014/0302683 A1 | 10/2014 | Kikuchi et al. | |

FOREIGN PATENT DOCUMENTS

| | | |
|---|---|---|
| JP | 2008034734 A | 2/2008 |
| KR | 1020010080467 A | 8/2001 |
| KR | 20060063714 A | 6/2006 |
| KR | 20090016874 A | 2/2009 |
| KR | 20100088128 A | 8/2010 |
| KR | 20140051332 A | 4/2014 |
| WO | WO 2005117082 A1 | 12/2005 |

* cited by examiner

METHOD FOR FABRICATING SEMICONDUCTOR DEVICES

CROSS-REFERENCE TO RELATED APPLICATIONS

This application claims priority under 35 U.S.C. §119 to Korean Patent Application No. 10-2014-0145352, filed on Oct. 24, 2014, the contents of which are hereby incorporated herein by reference in its entirety.

BACKGROUND OF THE INVENTION

The present inventive concept relates to a method for fabricating a semiconductor device and, more particularly, to a method for fabricating a semiconductor device using an etching gas capable of etching multi-stacked layers.

In the electronics industry, semiconductor devices are used due to their compact, multi-functional, and/or lower cost characteristics. These semiconductor devices may include memory devices for storing data, logic devices for operating data, and hybrid devices for simultaneously performing various functions.

The development of the electronics industry has intensified the demand for greater integration of semiconductor devices. However, it has been difficult to implement the greater integration of semiconductor devices due to many problems, such as reduced process margin in the exposure process for defining fine patterns. Further, the development of the electronics industry has also intensified the demand for semiconductor devices with higher speed and performance. Numerous studies have been carried out to meet the demands for semiconductor devices having greater integration and/or higher speed.

SUMMARY OF THE INVENTION

According to some embodiments of the inventive concept, methods are provided for fabricating a semiconductor device in which multi-stacked layers can be etched at once using an etching gas.

According to an embodiment of the present inventive concept, provided is a method for fabricating a semiconductor device may comprise: forming a first etching layer and a second etching layer stacked on a substrate; and forming a recess region by etching the first and second etching layers under plasma generated from an etching gas including a compound represented by Formula 1 or 2.

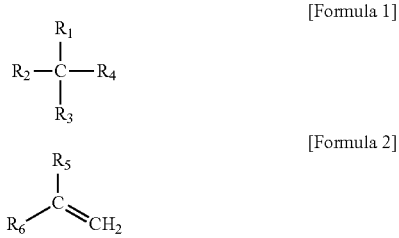

The first etching layer may include a material different from that of the second etching layer. In Formula 1, $R_1$ may be F or $CF_3$. $R_2$ may be $CHF_2$, $CH_2F$, I, SH or SOH. $R_3$ and $R_4$ may be independently selected from H, F or $CHF_2$. In Formula 2, $R_5$ may be F or $CF_3$. $R_6$ may be F, $CHF_2$ or $CH_2F$.

In another embodiment of the present inventive concept, the first and second etching layers may be etched by a single process with the plasma generated from the etching gas.

In yet another embodiment of the present inventive concept, the first etching layer may include a silicon oxide layer and the second etching layer may include one of a silicon nitride layer and a silicon oxynitride layer.

In yet another embodiment of the present inventive concept, the compound represented by Formula 1 may comprise at least one of 1,1,1,2,3,3-hexafluoropropane, 2,2,2-trifluoroethane-1-thiol, 1,1,1,3,3-pentafluoropropane, 1,1,2,2,3-pentafluoropropane and 1,1,2,2-tetrafluoro-1-iodoethane. The compound represented by Formula 2 may comprise at least one of 2,3,3,3-tetrafluoropropene and 1,1-difluoroethene.

In yet another embodiment of the present inventive concept, the plasma generated from the etching gas provides a first active species, a second active species and a third active species, wherein: the first active species comprises at least one selected from the group consisting of $CF3^+$, $CF2^+$ and $CF^+$; the second active species comprises at least one selected from $CHF2^+$ or $CH2F^+$; and the third reactive species comprises at least one selected from the group consisting of $C_xF_y$, S, SO and I.

In yet another embodiment of the present inventive concept, the etching gas may further comprise at least one of $C_4F_8$, $C_4F_6$ and $O_2$.

In yet another embodiment of the present inventive concept, the etching gas comprises at least two compounds represented by Formula 1 or 2.

In yet another embodiment of the present inventive concept, the etching may be performed under a pressure of about 1 mTorr to about 200 mTorr at a temperature of about 25° C. to about 200° C.

In yet another embodiment of the present inventive concept, the recess region may have an aspect ratio of about 5 to about 150.

In yet another embodiment of the present inventive concept, the recess region may include a hole extending a direction perpendicular to a top surface of the substrate or a trench extending a direction parallel to the top surface of the substrate.

In yet another embodiment of the present inventive concept, before forming the recess region, the method may further comprise forming a mask pattern on the first and second etching layers. The mask pattern may include an opening to define a plan shape of the recess region. The etching gas may selectively etch the first and second etching layers.

In yet another embodiment of the present inventive concept, forming the first and second etching layers may comprise stacking sacrificial layers and insulating layers alternately and repeatedly on the substrate to form a thin-film structure. The recess region may include a channel hole penetrating the thin-film structure to expose the substrate.

In yet another embodiment of the present inventive concept, forming the first and second etching layers may comprise stacking sacrificial layers and insulating layers alternately and repeatedly on the substrate to form a thin-film structure. The recess region may include a trench penetrating the thin-film structure to expose the substrate and extending in a direction parallel to a top surface of the substrate.

According to yet another embodiment of the present inventive concept, a method for fabricating a semiconductor device may comprise: forming an etching layer stacked on a substrate; and forming a recess region by etching the etching layer under plasma generated from an etching gas including a compound represented by Formula 1.

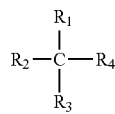

[Formula 1]

In yet another embodiment of the present inventive concept, $R_1$, may be F or $CF_3$. $R_2$ may be I, SH or SOH. $R_3$ and $R_4$ may be independently selected from H, F or $CHF_2$.

In yet another embodiment of the present inventive concept, the etching layer may comprise a first etching layer and a second etching layer sequentially stacked on the substrate. The first etching layer may include a silicon oxide layer and the second etching layer may include one of a silicon nitride layer and a silicon oxynitride layer.

In yet another embodiment of the present inventive concept, the etching gas may further comprise $O_2$. The mole fraction of $O_2$ may range from about 0.5 to about 1.0 based on the compound represented by Formula 1.

In yet another embodiment of the present inventive concept, the compound represented by Formula 1 may comprise at least one of 2,2,2-trifluoroethane-1-thiol and 1,1,2,2-tetrafluoro-1-iodoethane.

In yet another embodiment of the present inventive concept, provided is a memory system and/or a semiconductor device fabricated according to methods of the present inventive concept.

In yet another embodiment of the present inventive concept, provided are systems, for example, devices configured to communicate data wirelessly, and information processing systems, comprising a memory system and/or a semiconductor device fabricated according to methods of the present inventive concept.

BRIEF DESCRIPTION OF THE DRAWINGS

The foregoing and other features and advantages of embodiments of inventive concepts will be apparent from the more particular description of the following non-limiting embodiments of inventive concepts, as illustrated in the accompanying drawings, in which like reference characters refer to the same parts throughout the different views. The drawings are not necessarily to scale, emphasis instead being placed upon illustrating the principles of inventive concepts.

DETAILED DESCRIPTION OF EXEMPLARY EMBODIMENTS

Figure 1A:
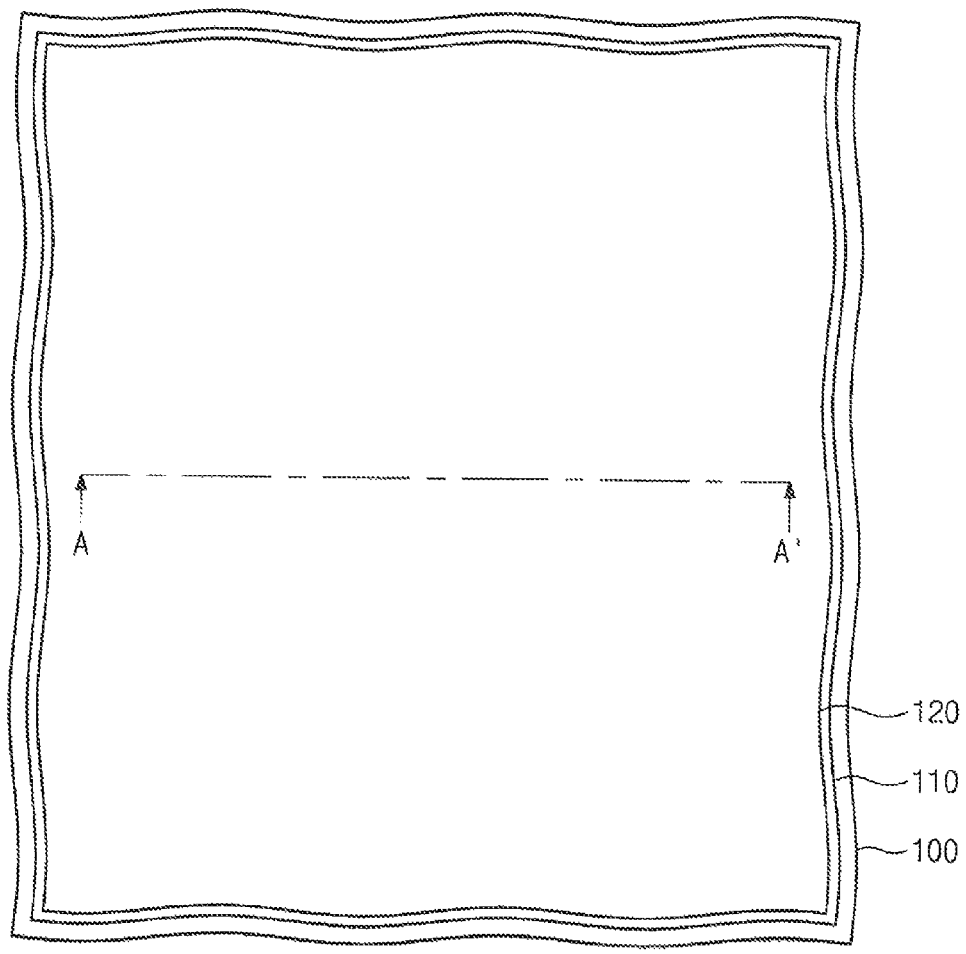
FIGS. 1A, 2A and 3A illustrate plan views of a method for fabricating a semiconductor device according to an exemplary embodiment of the present inventive concept.

Embodiments of inventive concepts will now be described more fully hereinafter with reference to the accompanying drawings, in which some exemplary embodiments of inventive concepts are shown. These embodiments, however, should not be construed as being limited to the exemplary embodiments more particularly set forth herein; rather, these embodiments are provided so that this disclosure will be thorough and complete, and will fully convey the scope of these embodiments of inventive concepts to those of skill in the art. In the drawings, the thicknesses of layers and regions are exaggerated for clarity. Like reference numerals in the drawings denote like elements. Hereinafter, exemplary embodiments of the present invention will be described in conjunction with the accompanying drawings.

The terminology used herein is for the purpose of describing particular embodiments only and is not intended to be limiting of the invention. As used herein, the singular forms "a," "an" and "the" are intended to include the plural forms as well, unless the content clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that although the terms "first," "second" and "third," etc. may be used herein to describe various patterns, regions, layers, and/or sections, these patterns, regions, layers, and/or sections should not be limited by these terms. These terms are only used to distinguish one region, layer, or section from another region, layer, or section. Thus, a first region, layer, or section discussed below could be termed a second region, layer, or section, and similarly, a third without departing from the teachings of the present invention. Thus, the terms "first," "second" and "third," etc. are not intended to convey a sequence or other hierarchy to the associated elements but are used for identification purposes only. The sequence of operations (or steps) is not limited to the order presented in the claims or figures unless specifically indicated otherwise.

It will be understood that when an element is referred to as being "on," "connected" to, "coupled" with, etc., another element, it can be directly on, connected to or coupled with the other element or intervening elements may also be present. It will also be appreciated by those of skill in the art that references to a structure or feature that is disposed "adjacent" another feature may have portions that overlap or underlie the adjacent feature.

Spatially relative terms, such as "lower," "bottom," "upper," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as at the "bottom" would then be on "top." The device in the figures may be otherwise oriented (rotated 90 degrees or at other orientations) and the spatially relative descriptors used herein interpreted accordingly. Similarly, the terms "uppermost," "lowermost," "vertical" and the like are used herein for the purpose of explanation only unless specifically indicated otherwise.

Figure 1B:
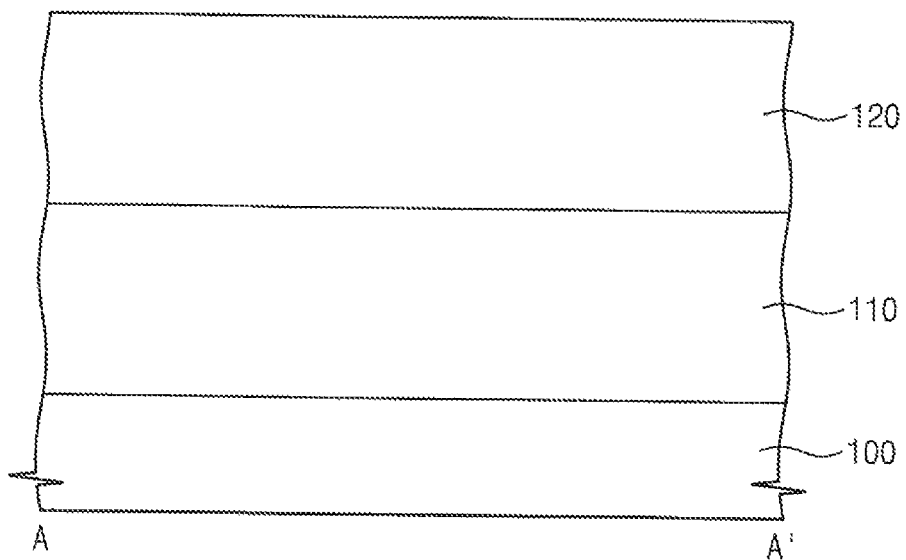
FIGS. 1B, 2B and 3B illustrate cross-sectional views taken along line A-A' of FIGS. 1A, 2A and 3B, as well as along line A-A' of FIGS. 4, 5 and 6, respectively.
Figure 2A:
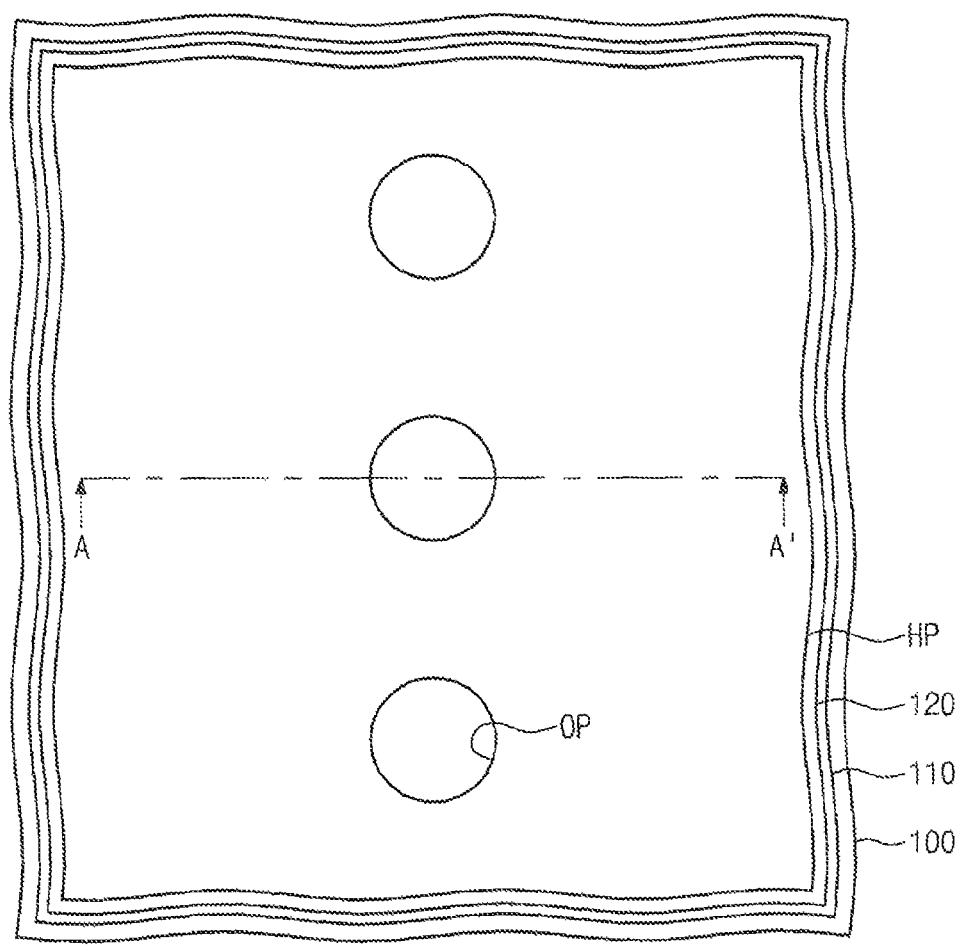
Figure 2B:
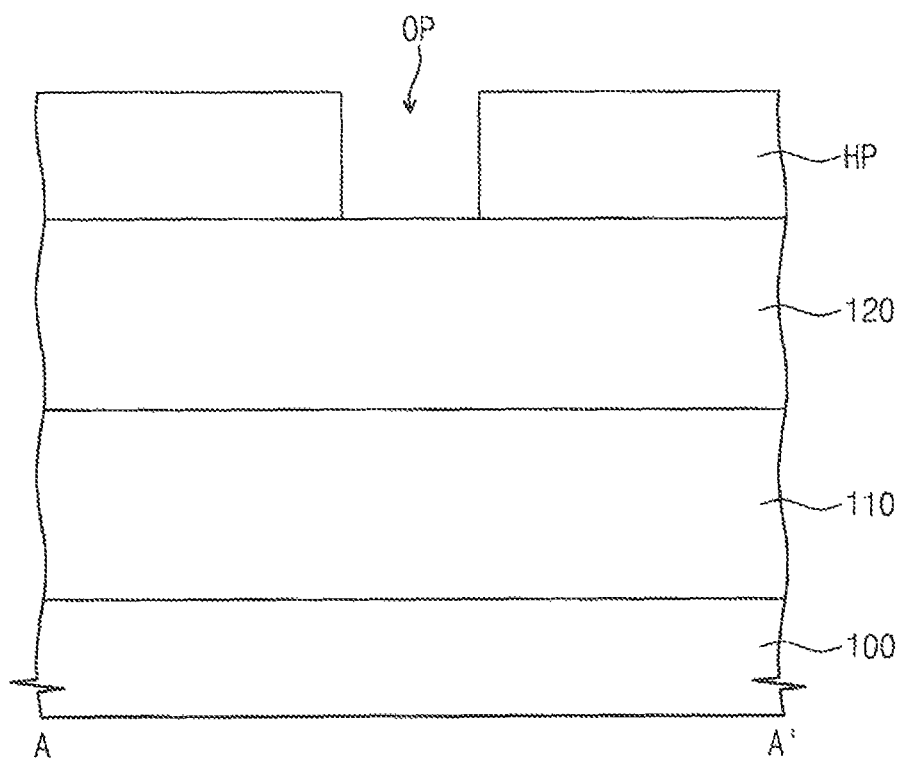
Figure 3A:
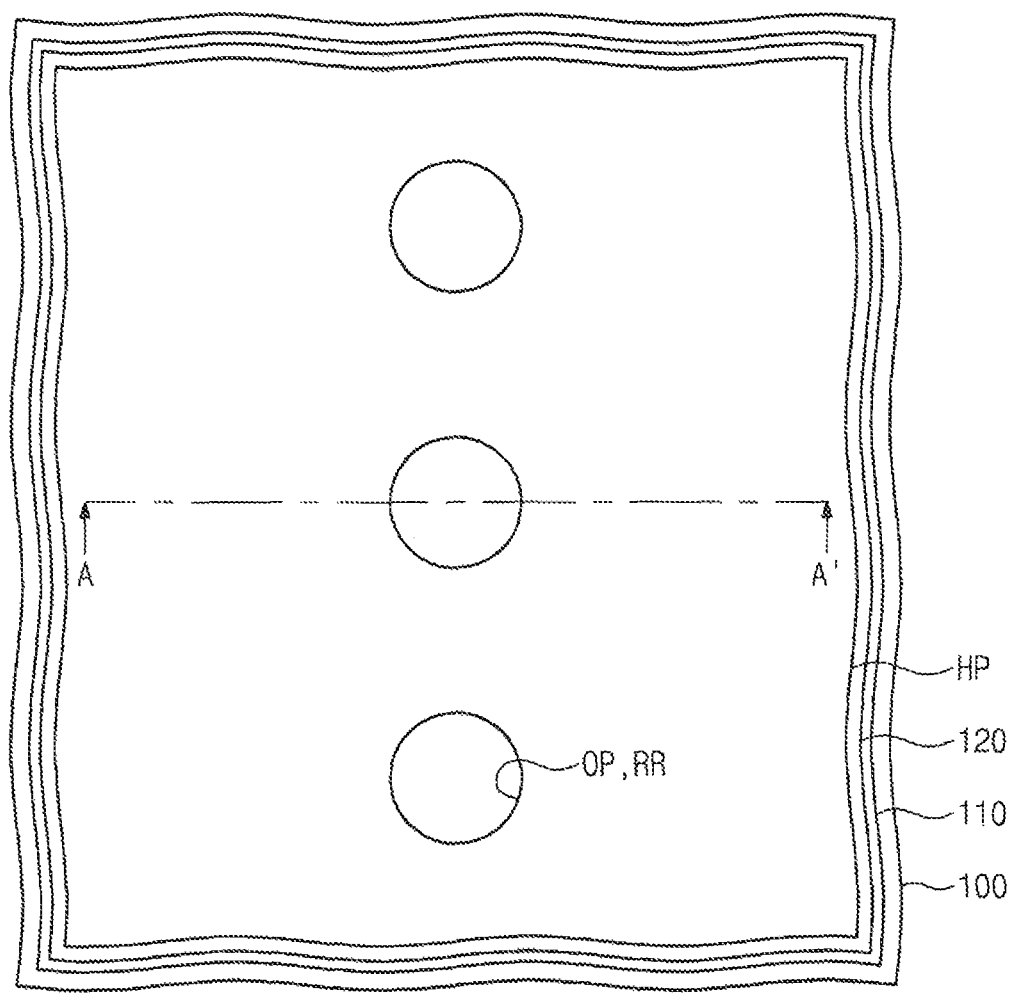
Figure 3B:
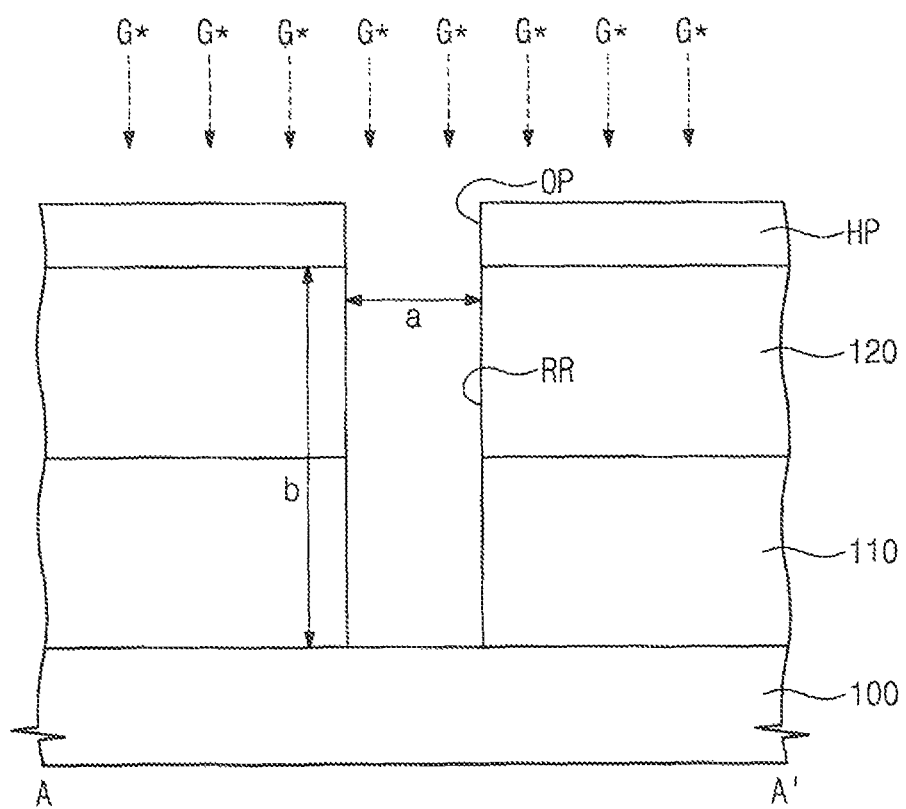

FIGS. 1A, 2A and 3A illustrate plan views of a method for fabricating a semiconductor device according to an exemplary embodiment of the present invention. FIGS. 1B, 2B and 3B illustrate cross-sectional views taken along line A-A' of FIGS. 1A, 2A and 3A, respectively.

Referring to FIGS. 1A and 1B, a first layer 110 to be etched (hereinafter referred to as a first etching layer) and a second layer 120 to be etched (hereinafter referred to as a second etching layer) may be sequentially formed on a substrate 100. The substrate 100 may be a semiconductor substrate or a compound semiconductor substrate including silicon, germanium, silicon-germanium, etc.

Figure 9A:
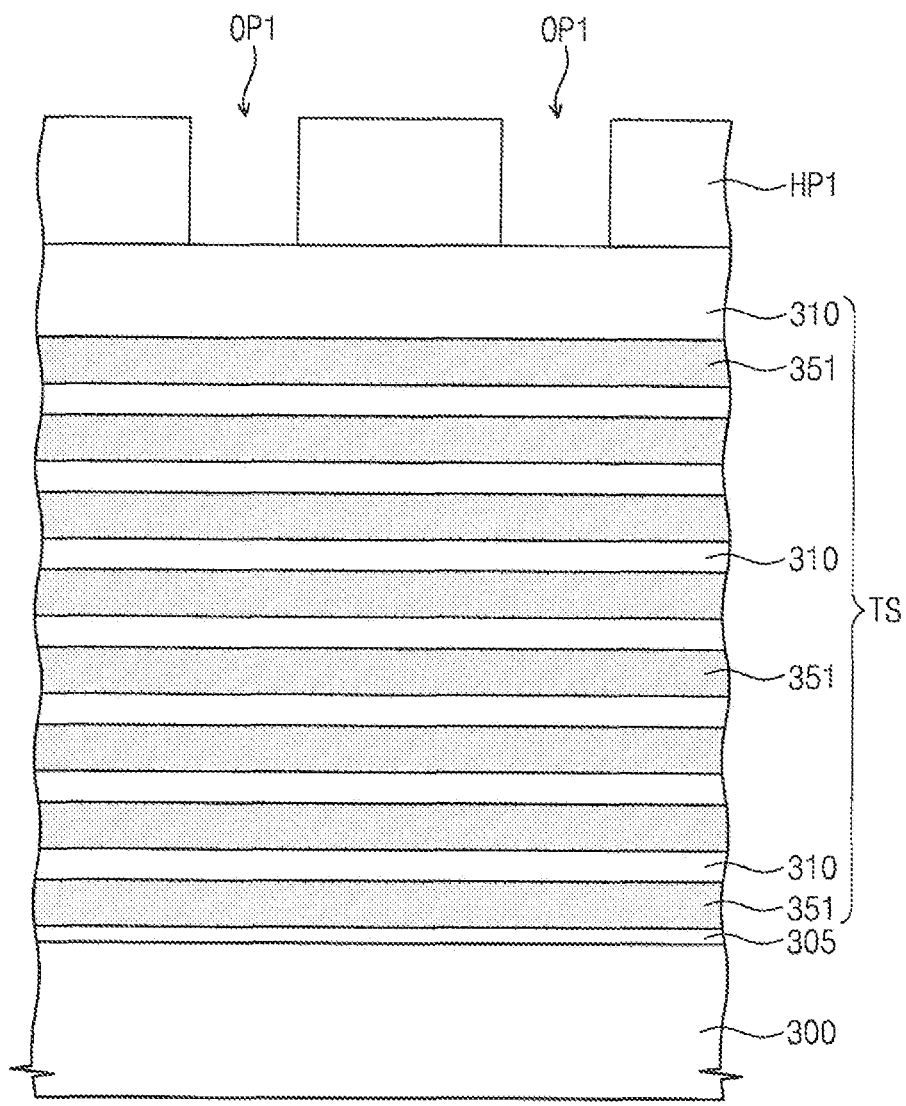
FIGS. 9A to 9H illustrate cross-sectional views of a method for fabricating a semiconductor device according to another exemplary embodiment of the present inventive concept.

The first etching layer 110 and the second etching layer 120 may each comprise a silicon oxide layer, a silicon nitride layer, or a silicon oxynitride layer. The first etching layer 110 may comprise a material different from that of the second etching layer 120. For example, the first etching layer 110 may comprise a silicon oxide layer and the second etching layer 120 may comprise a silicon nitride layer. Alternatively, a plurality of first etching layers 110 and a plurality of second etching layers 120 may be stacked alternately and repeatedly, for example, such as a plurality of sacrificial layers 351 and a plurality of insulating layers 310 stacked alternatively and repeatedly as shown in FIG. 9A.

Referring to FIGS. 2A and 2B, a mask pattern HP having openings OP therein may be formed on the second etching layer 120. For example, a mask layer may be formed on the second etching layer 120 and then the mask layer may be patterned to form the mask pattern HP.

The mask layer may comprise a material different from those of the first and second etching layers 110 and 120. The mask layer may comprise a material having a low etch selectivity with respect to an etching gas which will be described below. For example, the mask layer may comprise a polysilicon layer or an amorphous carbon layer.

The mask layer may be patterned to form the openings OP. The openings OP may partially expose a top surface of the second etching layer 120. The openings OP may define a plan shape of recess regions which will be discussed below in FIGS. 3A and 3B. For example, the openings OP may have a circular shape in a plan view.

Referring to FIGS. 3A and 3B, the first and second etching layers 110 and 120 may be etched using the mask pattern HP as an etch mask to form a plurality of recess regions RR. The recess regions RR may be formed to be a hole. For example, if the openings OP have a circular shape as illustrated in FIG. 2A, the recess regions RR may be formed to be a cylindrical-shaped hole. The recess region RR may have a high aspect ratio. The aspect ratio of the recess region RR may be defined as the ratio of its height b to its width a, i.e., the ratio of b/a. For example, in some embodiments, the aspect ratio of the recess region RR may be about 5 to about 150. In other embodiments, the aspect ratio may be about 45 or greater to about 150. A portion of the mask pattern HP may be etched simultaneously with the first and second etching layers 110 and 120, which may result in reducing the thickness of the mask pattern HP.

A process for etching of the first and second etching layers 110 and 120 may be a dry etching process using a plasma G* generated from an etching gas including a compound represented by Formula 1 or 2 below.

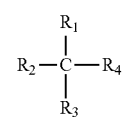

[Formula 1]

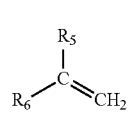

[Formula 2]

In Formula 1, $R_1$, may represent F or $CF_3$; $R_2$ may designate $CHF_2$, $CH_2F$, I, SH or SOH; and $R_3$ and $R_4$ may independently denote H, F or $CHF_2$.

In Formula 2, $R_5$ may express F or $CF_3$, and $R_6$ may show F, $CHF_2$ or $CH_2F$.

For example, the compound of Formula 1 may comprise 1,1,1,2,3,3-hexafluoropropane represented by Formula 3 below.

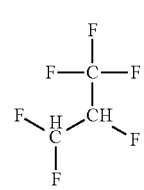

[Formula 3]

The compound of Formula 1 may comprise 2,2,2-trifluoroethane-1-thiol represented by Formula 4 below.

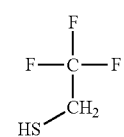

[Formula 4]

The compound of Formula 1 may comprise 1,1,1,3,3-pentafluoropropane represented by Formula 5 below.

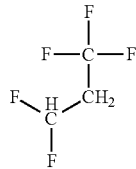

[Formula 5]

The compound of Formula 1 may comprise 1,1,2,2,3-pentafluoropropane represented by Formula 6 below.

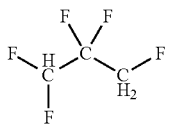

[Formula 6]

The compound of Formula 1 may comprise 1,1,2,2-tetrafluoro-1-iodoethane represented by Formula 7 below.

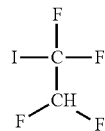

[Formula 7]

The compound of Formula 2 may comprise 2,3,3,3-tetrafluoropropene represented by Formula 8 below.

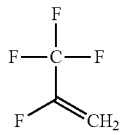

[Formula 8]

The compound of Formula 2 may comprise 1,1-difluoroethene represented by Formula 9 below.

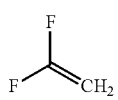

[Formula 9]

When a single process is conventionally performed to etch the first etching layer 110 (e.g., silicon oxide layer) and the second etching layer 120 (e.g., silicon nitride layer), a gas mixture of a first gas capable of etching the silicon oxide layer and a second gas capable of etching the silicon nitride layer is typically used. The first gas may comprise $CF_4$ and/or $C_4F_8$ represented by Formula 10 below. The second gas may comprise $CHF_3$ and/or $CH_2F_2$.

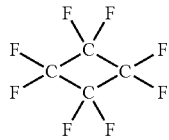

[Formula 10]

The gas mixture may further comprise a third gas to improve the etch selectivity. The third gas may comprise $C_4F_6$ represented by Formula 11. The third gas may form a passivation layer on the mask pattern HP to improve the etch selectivity.

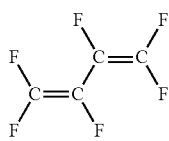

[Formula 11]

When the first and second etching layers 110 and 120 are etched under plasma generated from a conventional gas mixture, it may be difficult to control the etching profile due to the mixing of gases.

Figure 3C:
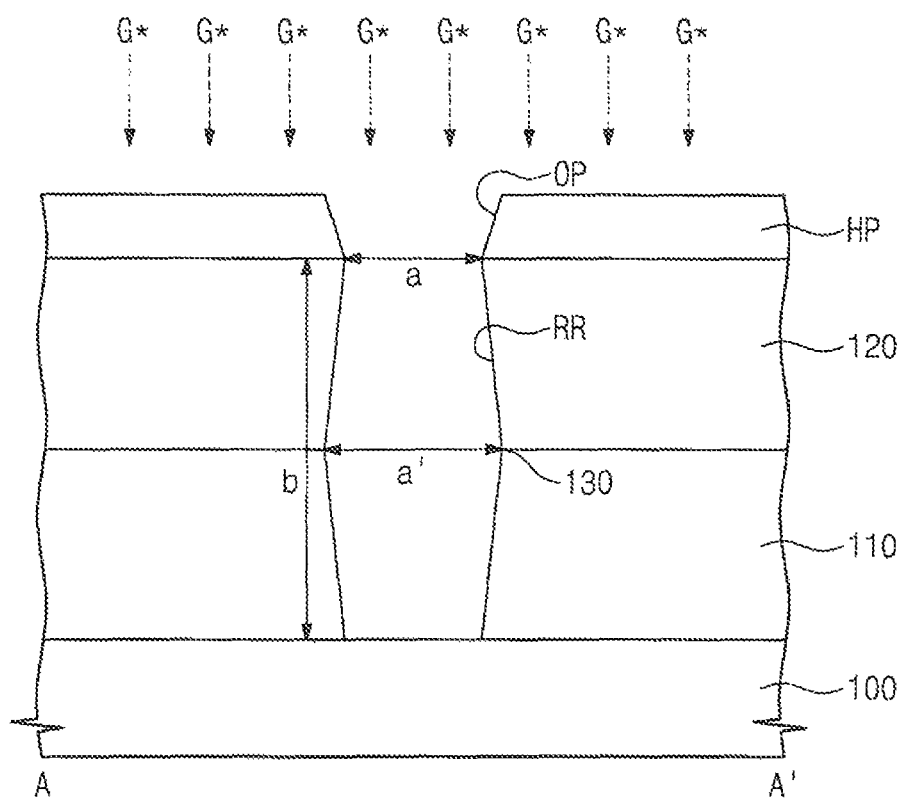
FIG. 3C illustrates a cross-sectional view taken along line A-A' of FIG. 3A in case that conventional gas mixture is used as an etching gas.

FIG. 3C illustrates a cross-sectional view taken along line A-A' of FIG. 3A in case that conventional gas mixture is used as an etching gas.

Referring to FIGS. 3A and 3C, since it is difficult to control an etching profile under plasma generated from a conventional gas mixture, at least due to the mixing of gases, a bow 130 is be created in the recess region RR. The bow 130 can occur at a boundary between the first etching layer 110 and the second etching layer 120. The recess region RR then may have a region, where the bow 130 has occurred, in which width a' is greater than width a of an upper portion of the recess region RR. This poor etch profile of the recess region RR is due to the fact that it is difficult to selectively control the etching of the first and second etching layers 110 and 120 under the condition of plasma G* generated from a conventional gas mixture.

Specifically, the first, second and third gases in the conventional gas mixture may be independently excited under the condition of plasma G*. These excitations may create active species including ions originated from the various gases included in the gas mixture. The active species may reciprocally interact with each other such that the control of etch profile may be difficult.

For these reasons described above, the mask pattern HP may experience heavy erosion, and/or the recess region RR is be formed having an inclined inner sidewall thereof. Furthermore, the problems discussed previously herein are more severe when the recess region RR is formed to have an aspect ratio of 45 or greater.

Referring back to FIGS. 3A and 3B, an etching gas according to exemplary embodiments of the inventive concept may comprise a compound represented by Formula 1 or 2. Under the condition of plasma G*, the compound of Formula 1 or 2 may provide a first active species capable of etching the first etching layer 110 (e.g., the silicon oxide layer), a second active species capable of etching the second etching layer 120 (e.g., the silicon nitride layer), and a third active species capable of enhancing the etching selectivity. The first active species may comprise one or more selected from the group consisting of $CF_3^+$, $CF_2^+$ or $CF^+$. The second active species may comprise one or more selected from the group consisting of $CHF_2^+$ or $CH_2F^+$. The third active species may comprise one or more selected from the group consisting of $C_xF_y$, S, SO or I. The ratio of x to y (x:y) may be 1 or more.

The third active species including sulfur (S) may strengthen the passivation layer on the mask pattern HP. The third active species including iodine (I) may improve an etch directionality so that straight anisotropic etches can be achieved.

For example, 1,1,1,2,3,3-hexafluoropropane, which is represented by Formula 3, may be excited under the condition of plasma G* to provide active species comprising at least one of $CHF_2^+$, $CF_3^+$, $CH_2F^+$, $CF^+$ and $C_2H_2F_2^+$.

The etching gas according to an embodiment of the invention may provide the first, second and third active species from one gas under the condition of plasma G* to easily control the etching profile compared to the gas mixture discussed above. Moreover, the etching gas may etch the first and second etching layers 110 and 120, which are alternately stacked one above the other and formed of different materials, to form the recess region RR having a high aspect ratio, for example, a ratio of about 45 or greater, without the bow 130.

A process using the plasma G* generated from the etching gas may be performed under a pressure of about 1 mTorr to about 10 Torr, and in some embodiments, under a pressure of about 1 mTorr to about 200 mTorr, at a temperature of about 25° C. to about 600° C., and in some embodiments, at a temperature of about 25° C. to about 200° C. The plasma G* may be generated by a direct plasma method, a remote plasma method, a microwave plasma method, an inductively-coupled plasma method, a capacitively-coupled plasma method, or an electron cyclotron resonance plasma method. An etching chamber may be variously designed to be consistent with one of plasma generation methods described above.

An etching gas according to another embodiment of the invention may comprise at least two compounds represented by Formula 1 or 2. For example, the etching gas may comprise at least two compounds selected from those represented by Formulas 3 to 9. In this case, one compound may compensate for the lack of etching-ability of other compound.

For example, 1,1,1,2,3,3-hexafluoropropane represented by Formula 3 or 1,1,1,3,3-pentafluoropropane represented by Formula 5 may comprise a relatively large amount of the first and second active species but contain a relatively small amount of the third active species, under the condition of plasma G*. Meanwhile, 2,2,2-trifluoroethane-1-thiol represented by Formula 4 may comprise a relatively large amount of the third active species such as $CH_3S^+$ and $CHS^+$. The first and second etching layers 110 and 120 may then be effectively etched using 2,2,2-trifluoroethane-1-thiol (the compound of Formula 4) mixed with one of 1,1,1,2,3,3-hexafluoropropane (the compound of Formula 3) and 1,1,1,3,3-pentafluoropropane (the compound of Formula 5).

The etching gas may further comprise at least one compound selected from $C_4F_8$, $C_4F_6$ and $O_2$. As such, the recess regions RR may be easily formed. $O_2$ may be provided to have a mass flow rate about 0.5 to about 1.0 times that of compound represented by Formula 1 or 2. In other words, $O_2$ may be provided to an etching chamber to have a mole fraction of about 0.5 to about 1.0 based on the compound represented by Formula 1 or 2.

Figure 4:
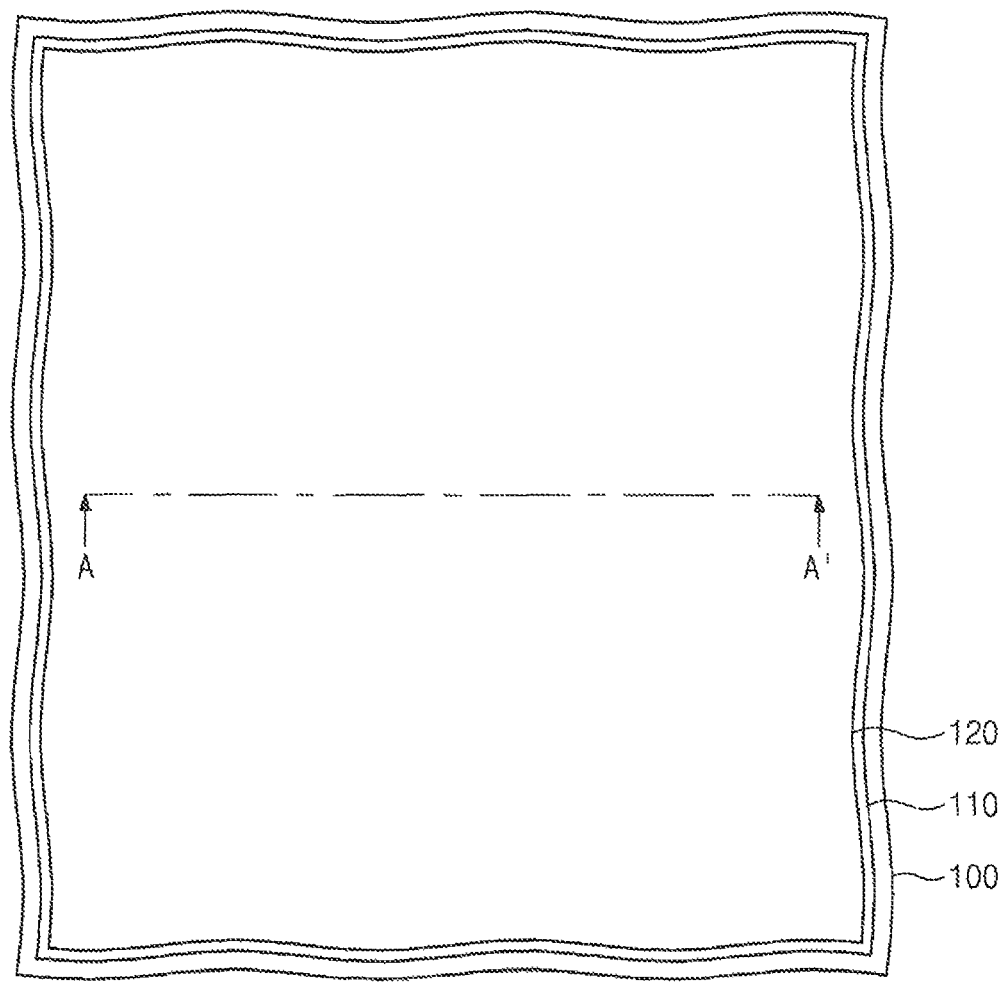
FIGS. 4, 5 and 6 illustrate plan views of a method for fabricating a semiconductor device according to another exemplary embodiment of the present inventive concept.
Figure 5:
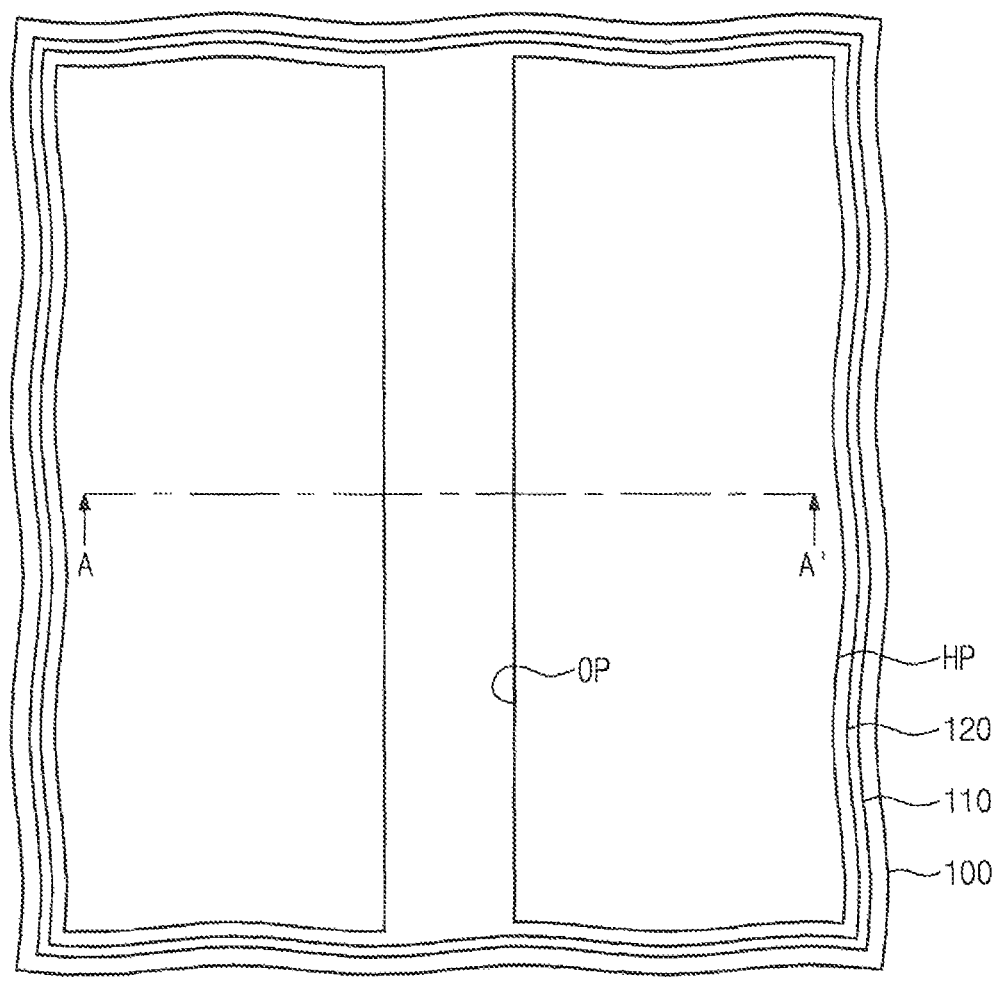
Figure 6:
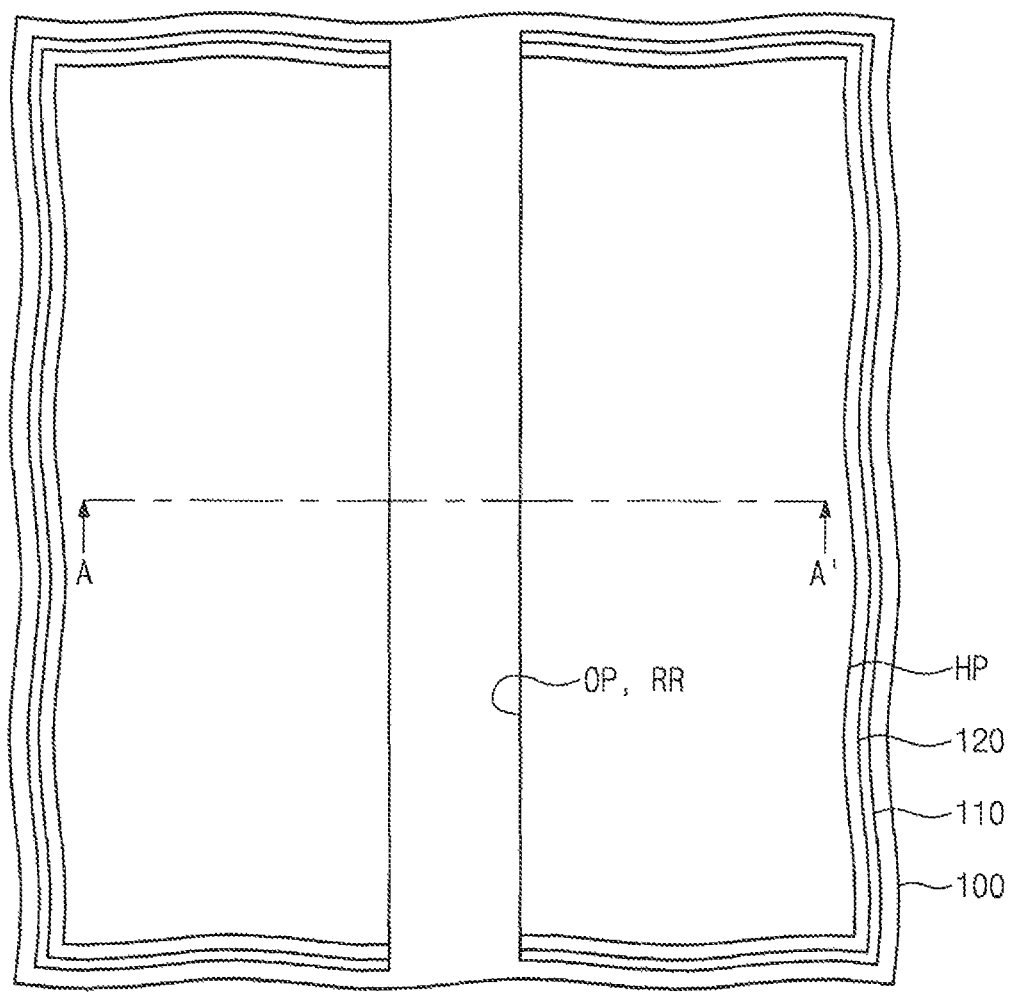

FIGS. 4, 5 and 6 illustrate plan views of a method for fabricating a semiconductor device according to another exemplary embodiment of the present inventive concept. FIGS. 1B, 2B and 3B illustrate cross-sectional views taken along line A-A' of FIGS. 4, 5 and 6, respectively. In the description of this embodiment that follows, the descriptions of features are the same as those in the method for fabricating the semiconductor device with reference to FIGS. 1A, 2A and 3A and FIGS. 1B, 2B and 3B in order to avoid repetition.

Referring to FIGS. 4 and 1B, the first etching layer 110 and the second etching layer 120 may be sequentially formed on the substrate 100.

Referring to FIGS. 5 and 2B, the mask pattern HP having an opening OP therein may be formed on the second etching layer 120. The opening OP may define a plan shape of a recess region, which will be discussed below in FIGS. 6 and 3B. For example, the opening OP may have a line shape extending in a direction parallel to a top surface of the substrate 100.

Referring to FIGS. 6 and 3B, the first and second etching layers 110 and 120 may be etched using the mask pattern HP as an etch mask to form a recess region RR. The recess region RR may be formed to be a trench. For example, if the opening OP has a line shape as illustrated in FIG. 5, the recess region RR may be formed to be a line shaped trench. The recess region RR may have a high aspect ratio of b/a. In some embodiments, the aspect ratio of the recess region RR may be about 5 to about 150. In other embodiments, the ratio of b/a may be about 45 or greater to about 150

A process for etching of the first and second etching layers 110 and 120 may be a dry etching process using plasma G* generated from an etching gas including a compound represented by Formula 1 or 2. The etching gas and the etching process may be substantially identical those discussed with reference to FIGS. 3A and 3B. As such, the first and second etching layers 110 and 120 having different materials may be effectively etched to form a trench with a high aspect ratio.

As shown in FIGS. 1A to 3A and FIGS. 1B to 3B, comparative experiments were carried out on the etching of a thin-film structure including silicon oxide layers and silicon nitride layers sequentially stacked on the substrate 100. The thin-film structure was etched under the same etching conditions for Example 1 and Comparative Example 1 except for the etching gas. Embodiment 1 was etched using 1,1,1,2,3,3-hexafluoropropane, represented by Formula 3, as the etching gas, whereas Comparative Example 1 was etched using a conventional gas mixture. The conventional gas mixture contained $C_4F_8$, represented by Formula 10, and $CH_2F_2$. The etching process was carried out under a pressure about 15 mTorr at a temperature of about 100° C. in a capacitively-coupled plasma environment made in a plasma chamber. Table 1 shows the etching results.

TABLE 1

|  | Selectivity | Bow (nm) | ER (nm/min) |
| --- | --- | --- | --- |
| Example 1 | 4.5 | 25.1 | 122.6 |
| Comparative Example 1 | 4.3 | 27.0 | 116.4 |

As shown in Table 1, compared with the Comparative 1, the etching gas of Example 1 exhibits: an improved selectivity (e.g., about 4.7% increase); less bow (e.g., about 7% decrease); and an enhanced etch rate (e.g., about 5.3% increase).

Additional experiments on the etching process were carried out using 1,1,1,3,3-pentafluoropropane (Example 2), i.e, the compound of Formula 5, and its structural isomer (Example 3). The structural isomer may be 1,1,2,2,3-pentafluoropropane, i.e., the compound of Formula 6.

These additional experiments were carried out under the same condition as previously described experiments, while changing the flow rate of oxygen to obtain etching rates of various layers. The results are shown in FIGS. 7A and 7B.

Figure 7A:
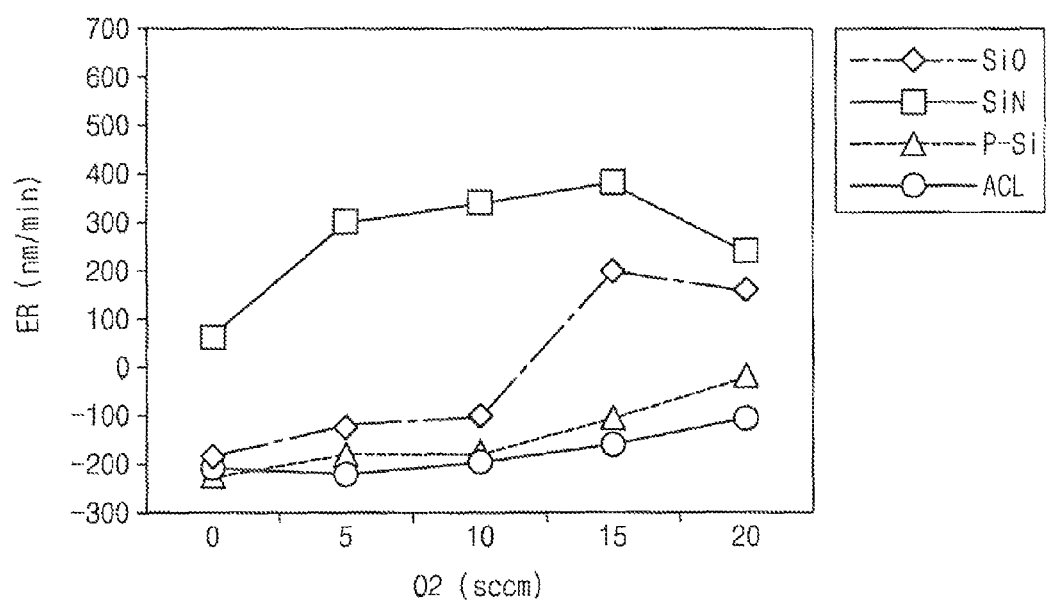
FIG. 7A is a graph illustrating etch rates of various layers based on flow rate of oxygen in the etching gas according to the present inventive concept.

FIG. 7A is a graph illustrating etch rates of various layers depending on flow rate of oxygen in the etching gas (Example 2) according to the present inventive concept. FIG. 7B is a graph illustrating etching rates of various layers depending on flow rate of oxygen in the structural isomer (Example 3).

Figure 7B:
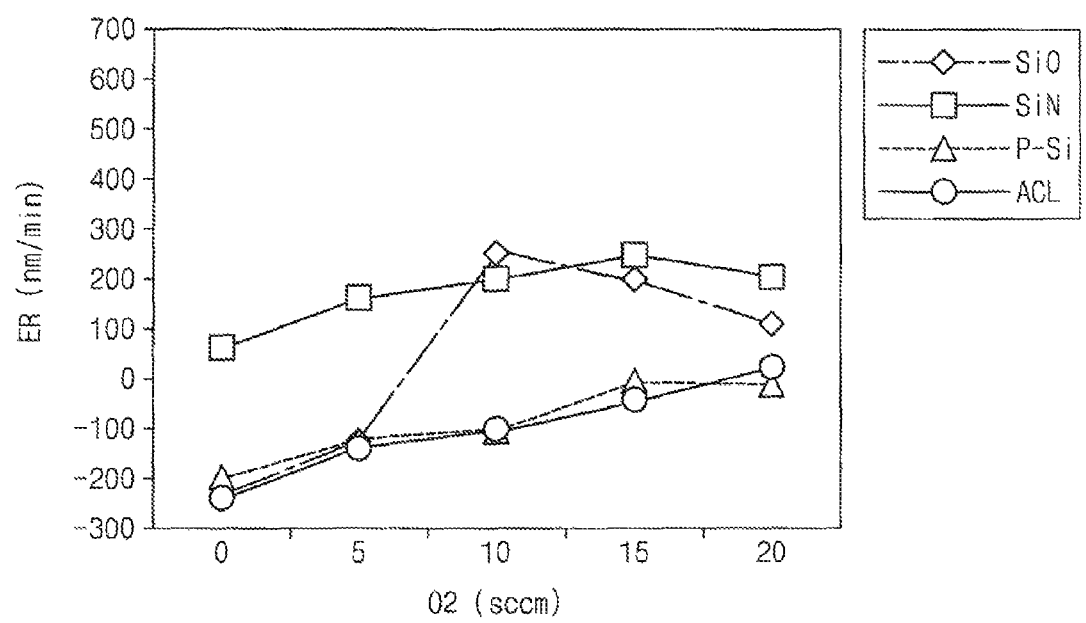
FIG. 7B is a graph illustrating etch rates of various layers based on flow rate of oxygen in the structural isomer.

Referring to FIGS. 7A and 7B, Embodiment 2 shows that the silicon oxide layer is etched at an etching rate of about 200 nm/min and the silicon nitride layer is etched at an etching rate of about 400 nm/min. Meanwhile, Example 3 shows that both silicon oxide layer and silicon nitride layer are etched at an etching rate of about maximum 200 nm/min, which is lower compared to Example 2.

Thus, as shown in these embodiments of the invention, it is possible to provide much improved etching results due to differences in the molecular structure between the etching gas and its structural isomer and differences in the active species generated due to the structural differences between the etching gas and its structural isomer.

The methods for fabricating semiconductor devices according to the inventive concept may be applicable to various methods for fabricating semiconductor devices, such as semiconductor memories. Methods for fabricating semiconductor devices according to some embodiments are fully hereinafter described below.

FIGS. 8A to 8H are illustrate cross-sectional views of a method for fabricating a semiconductor device according to an exemplary embodiment of the present inventive concept.

Figure 8A:
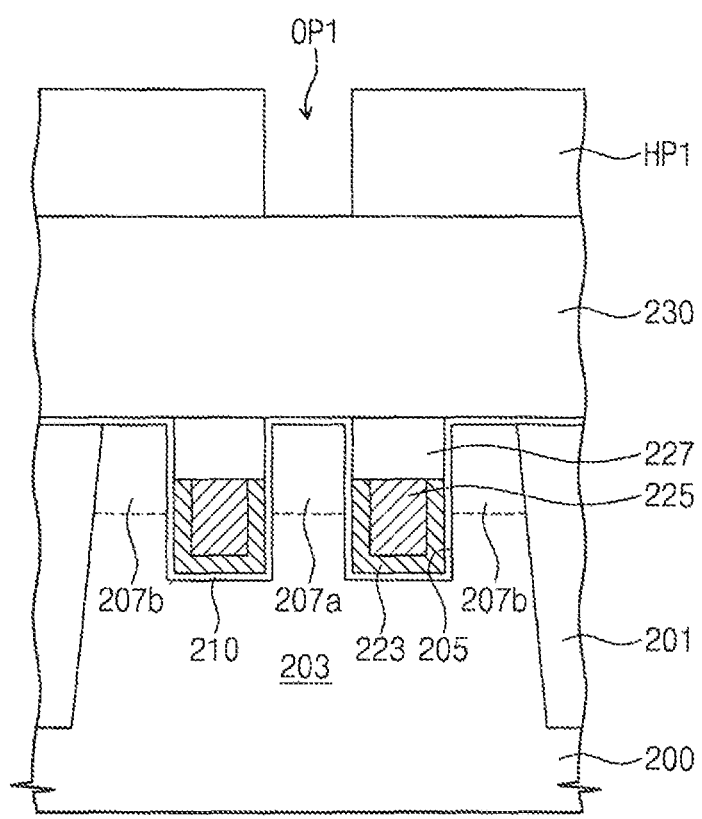
FIGS. 8A to 8H are illustrate cross-sectional views of a method for fabricating a semiconductor device according to an exemplary embodiment of the present inventive concept.

FIG. 8A, a substrate 200 may be provided to include a device isolation pattern 201 defining an active region 203. The device isolation pattern 201 may comprise an insulating material. For example, the device isolation pattern 201 may comprise at least one selected from silicon oxide, silicon nitride and silicon oxynitride. The substrate 200 may be, for example, a silicon substrate, a germanium substrate, or silicon-germanium substrate. The substrate 200 may be doped to have a first conductive type, for example, p-type.

A trench 205 may be formed in the substrate 200. The trench 205 may be formed to have a line shape extending in a first direction to cross the active region 203 and the device isolation pattern 201, in a plan view. The substrate 200 may have a plurality of trenches 205 formed therein. For example, a pair of the trenches 205 may cross the active region 203.

A plurality of gate electrodes may respectively be formed in the trenches 205. The gate electrode may include a bulk gate pattern 225 and a liner gate pattern 223. The bulk gate pattern 225 may be formed to place in the trench 205. The liner gate pattern 223 may be formed to interpose between the bulk gate pattern 225 and the trench 205. The bulk gate pattern 225 and the liner gate pattern 223 may each comprise at least one selected from a doped semiconductor, a conductive metal nitride (e.g., titanium nitride, tantalum nitride, tungsten nitride, etc.) and a metal (e.g., ruthenium, iridium, titanium, tungsten, tantalum, etc.). The bulk gate pattern 225 may comprise a material different from that of the liner gate pattern 223. For example, the bulk gate pattern 225 may comprise tungsten and the liner gate pattern 223 may comprise titanium nitride.

A gate dielectric layer 210 may be formed between the trench 205 and the liner gate pattern 223. The gate dielectric layer 210 may extend along an inner surface of the trench 205 and further extend to cover a top surface of the substrate 200. The gate dielectric layer 210 may comprise at least one selected from high-k material, silicon oxide, silicon nitride, silicon oxynitride. The high-k material may be an insulating material having a dielectric constant greater than that of silicon nitride. For example, the high-k material may comprise at least one selected from insulative metal oxides such as hafnium oxide and aluminum oxide.

A plurality of capping patterns 227 may respectively be formed on the gate electrodes in the trenches 205. The capping pattern 227 may be formed to cover a top surface of the gate electrode. The capping pattern 227 may comprise an insulating material. For example, the capping pattern 227 may comprise at least one selected from silicon oxide, silicon nitride and silicon oxynitride.

A plurality of impurity regions 207a and 207b may be formed in the active region 203 at both lateral sides of the trench 205. Each of the impurity regions 207a and 207b may be adjacent to the trench 205. For example, the active region 203 may have a first impurity region 207a and a pair of second impurity regions 207b. The first impurity region 207a may be formed in the active region 203 between a pair of the gate electrodes. Further, the pair of the gate electrodes and the first impurity region 207a may be disposed between the pair of second impurity regions 207b. Each of the first and second impurity regions 207a and 207b may have a second conductive type, for example, n-type, which is opposite to the first conductive type.

The impurity regions 207a and 207b may respectively be formed to have a floor surface at a predetermined depth below a top surface of the active region 203. The impurity regions 207a and 207b may be contact with lateral sidewalls of the trenches 205. The impurity regions 207a and 207b may be formed by implanting impurities into the active region 203. For example, each of the impurity regions 207a and 207b may have the floor surface substantially higher than a floor surface of the trench 205.

A first interlayer dielectric layer 230 may be formed on the substrate 200. The first interlayer dielectric layer 230 may be formed by performing one of a physical vapor deposition (PVD), a chemical vapor deposition (CVD) and an atomic layer deposition (ALD). The first interlayer dielectric layer 230 may correspond to the first etching layer 110 previously discussed with reference to FIG. 1B. For example, the first interlayer dielectric layer 230 may be formed of a silicon oxide layer, a silicon nitride layer or silicon oxynitride layer.

A first mask pattern HP1 may be formed on the first interlayer dielectric layer 230. For example, a mask layer may be formed on the first interlayer dielectric layer 230 and then the mask layer may be patterned to form the first mask pattern HP1.

The first mask pattern HP1 may comprise a first opening OP1 partially exposing a top surface of the first interlayer dielectric layer 230. The first opening OP1 may have a circular shape in a plan view. The first opening OP1 may vertically overlap the first impurity region 207a.

Figure 8B:
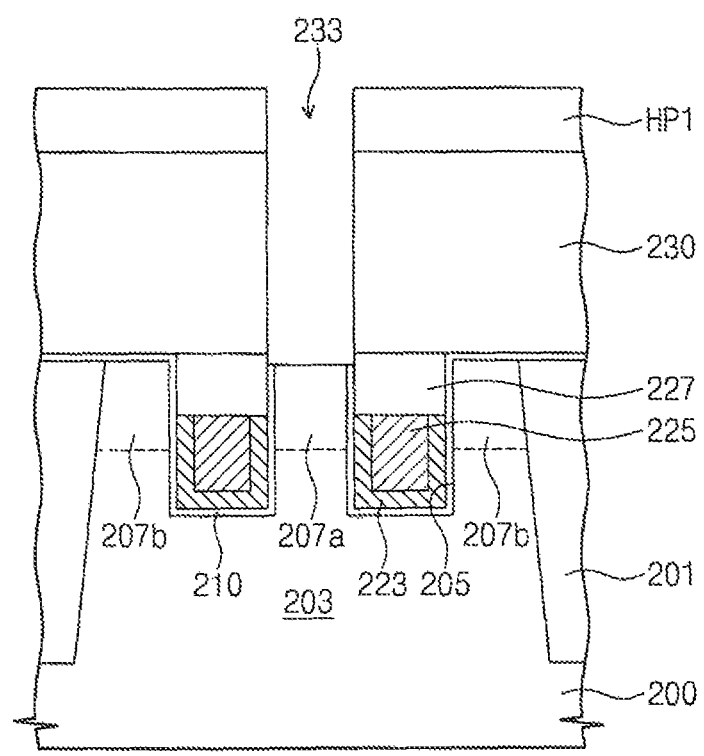

Referring to FIG. 8B, a first hole 233 may be formed to penetrate the first interlayer dielectric layer 233 such that the first impurity region 207a may be exposed through the first hole 233. The first hole 233 may be formed by etching the first interlayer dielectric layer 230 using the first mask pattern HP1 as an etch mask. The formation of the first hole 233 may be substantially identical to that of the recess regions RR previously discussed with reference to FIGS. 3A and 3B. For example, the etching process used in the formation of the first hole 233 may be a dry etching process performed under plasma generated from the etching gas comprising the compound represented by Formula 1 or 2. After forming the first hole 233, the first mask pattern HP1 may be removed.

Figure 8C:
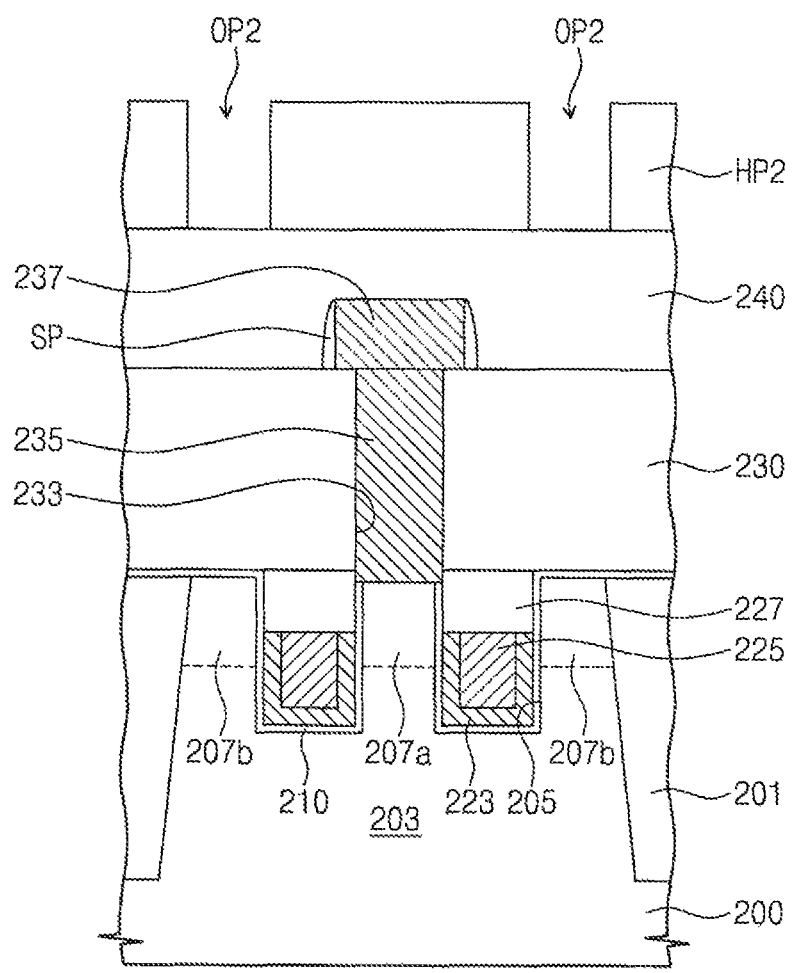

Referring to FIG. 8C, a first contact plug 235 may be formed in the first hole 233. The first contact plug 235 may comprise at least one selected from a semiconductor material (e.g., polycrystalline silicon), a metal-semiconductor compound (e.g., tungsten silicide), a conductive metal nitride (e.g., titanium nitride, tantalum nitride, tungsten nitride, etc.), and a metal (e.g., titanium, tungsten, tantalum, etc.).

A line 237 may be formed on the first interlayer dielectric layer 230 to be electrically connected to the first contact plug 235. The line 237 may have a line shape extending in a direction crossing a direction along which the trenches 205 extend, in a plan view. The line 237 may correspond to a bit line. The line 237 may comprise at least one selected from a semiconductor material (e.g., polycrystalline silicon), a metal-semiconductor compound (e.g., tungsten silicide), a conductive metal nitride (e.g., titanium nitride, tantalum nitride, tungsten nitride, etc.), and a metal (e.g., titanium, tungsten, tantalum, etc.).

The line 237 may be formed by a deposition process. For example, a conductive layer may be deposited on the first interlayer dielectric layer 230 and then the conductive layer may be patterned to form the line 237. Alternatively, the line 230 may be formed by a damascene process. For example, an insulating layer having an opening therein may be formed on the first interlayer dielectric layer 230 and then the opening may be filled with a conductive material to form the line 237. An upper portion of the insulating layer may be etched to form the opening. In this case, the formation of the opening may use a dry etching process performed under plasma generated from the etching gas comprising the compound represented by Formula 1 or 2. A portion of the insulating layer may remain to constitute spacers SP on sidewalls of the line 237.

A second interlayer dielectric layer 240 may be formed on the first interlayer dielectric layer 230 to cover the line 237. The second interlayer dielectric layer 240 may correspond to the second etching layer 120 previously discussed with reference to FIG. 1B. A chemical vapor deposition process may be used to form the second interlayer dielectric layer 240. The second interlayer dielectric layer 240 may include a silicon oxide layer, a silicon nitride layer or a silicon oxynitride layer.

A second mask pattern HP2 may be formed on the second interlayer dielectric layer 240. For example, a mask layer may be formed on the second interlayer dielectric layer 240 and then the mask layer may be patterned to form the second mask pattern HP2.

The second mask pattern HP2 may include a plurality of second openings OP2 partially exposing a top surface of the second interlayer dielectric layer 240. Each of the second openings OP2 may have a circular shape in a plan view. The second openings OP2 may vertically overlap the second impurity regions 207b, respectively.

Figure 8D:
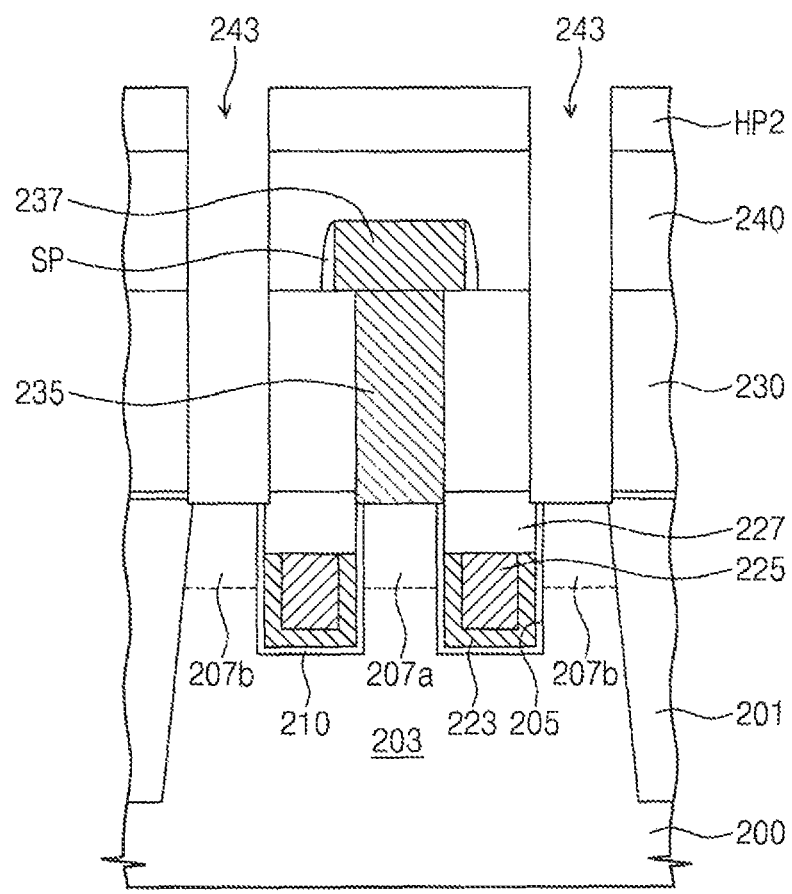

Referring to FIG. 8D, a plurality of second holes 243 may be formed to penetrate the first and second interlayer dielectric layers 230 and 240 such that the second impurity regions 207b may be exposed through the second holes 243. The second holes 243 may be formed by etching the first and second interlayer dielectric layers 230 and 240 using the second mask pattern HP2 as an etch mask. The formation of the second holes 243 may be substantially identical to that of the recess regions RR previously discussed with reference to FIGS. 3A and 3B. For example, the etching process used in the formation of the second holes 243 may be a dry etching process performed under plasma generated from the etching gas comprising the compound represented by Formula 1 or 2. After forming the second holes 243, the second mask pattern HP2 may be removed.

By using the etching gas according to the embodiment, the first and second interlayer dielectric layers 230 and 240 sequentially stacked may be simultaneously etched by a single etching process. Moreover, the second holes 243 may be formed to have a high aspect ratio without bows.

Figure 8E:
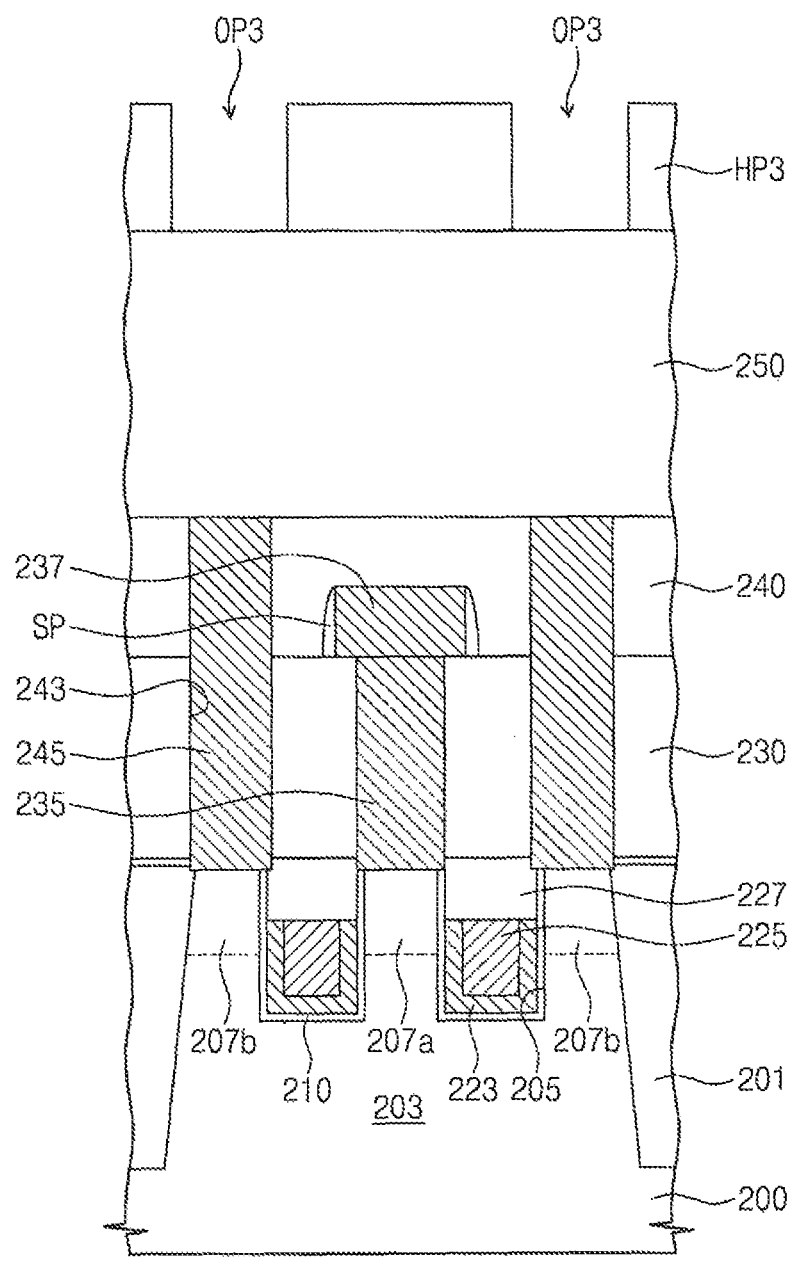

Referring to FIG. 8E, a plurality of second contact plugs 245 may be formed in the second holes 243. The second contact plug 245 may comprise at least one selected from a semiconductor material (e.g., polycrystalline silicon), a metal-semiconductor compound (e.g., tungsten silicide), a conductive metal nitride (e.g., titanium nitride, tantalum nitride, tungsten nitride, etc.), and a metal (e.g., titanium, tungsten, tantalum, etc.).

A sacrificial layer 250 may be formed on the second interlayer dielectric layer 240. The sacrificial layer 250 may comprise a silicon oxide layer, a silicon nitride layer or a silicon oxynitride layer. A third mask pattern HP3 may be formed on the sacrificial layer 250. For example, a mask layer may be formed on the sacrificial layer 250 and then the mask layer may be patterned to form the third mask pattern HP3.

The third mask pattern HP3 may comprise a plurality of third openings OP3 partially exposing a top surface of the sacrificial layer 250. Each of the third openings OP3 may have a circular shape in a plan view. The third openings OP3 may vertically overlap the second contact plugs 245, respectively.

Figure 8F:
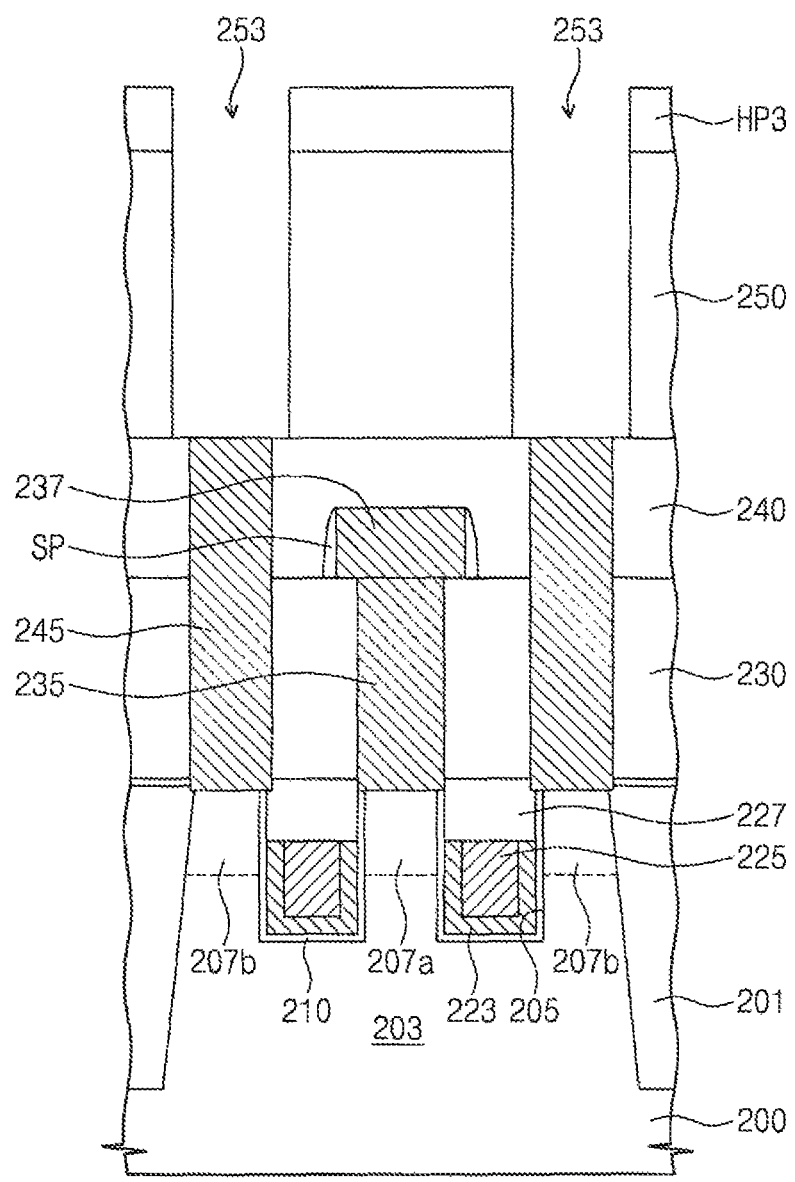

Referring to FIG. 8F, a plurality of third holes 253 may be formed in the sacrificial layer 250 to expose the second contact plugs 245. The third holes 253 may be formed by etching the sacrificial layer 250 using the third mask pattern HP3 as an etch mask. The formation of the third holes 253 may be substantially identical to that of the recess regions RR previously discussed with reference to FIGS. 3A and 3B. For example, the etching process used in the formation of the third holes 253 may be a dry etching process performed under plasma generated from the etching gas comprising the compound represented by Formula 1 or 2. After forming the third holes 253, the third mask pattern HP3 may be removed.

Figure 8G:
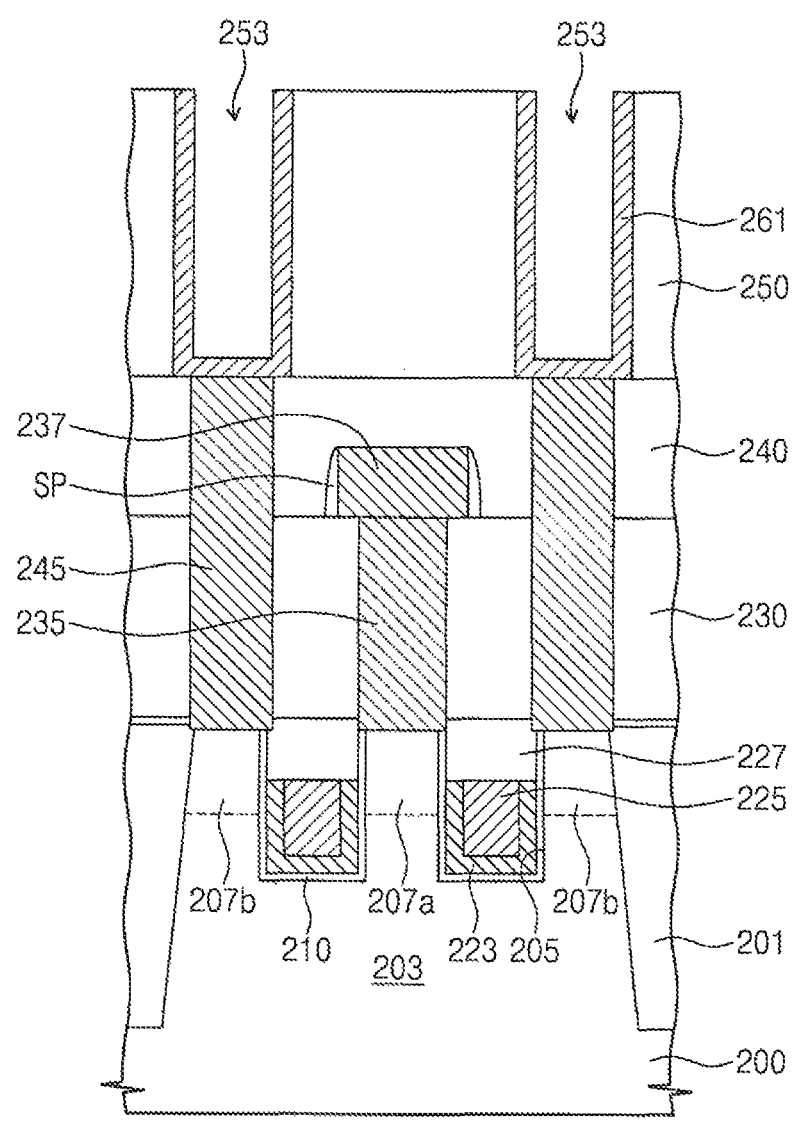

Referring to FIG. 8G, a plurality of first electrodes 261 may be formed to conformally cover inner surfaces of the third holes 253, respectively. For example, each of the first electrodes 261 may have a cylindrical shape. The first electrodes 261 may comprise a conductive material. For example, the first electrodes 261 may comprise at least one selected from a doped semiconductor, a conductive metal nitride (e.g., titanium nitride, tantalum nitride, tungsten nitride, etc.), a metal (e.g., ruthenium, iridium, titanium, tungsten, tantalum, etc.), and a conductive metal oxide (e.g., iridium oxide).

Figure 8H:
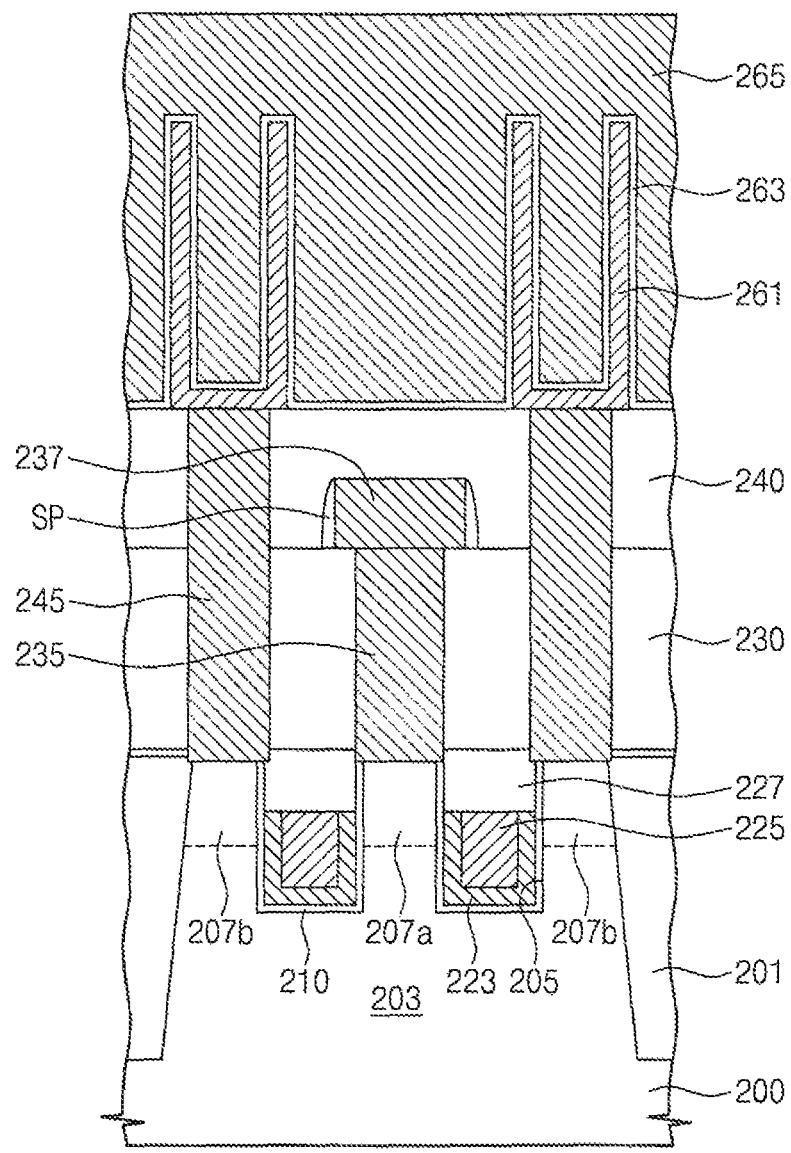

Referring to FIG. 8H, the sacrificial layer 250 may be removed and a capacitor dielectric layer 263 may be conformally formed on the second interlayer dielectric layer 240. The capacitor dielectric layer 263 may cover whole surfaces of the first electrodes 261. The capacitor dielectric layer 263 may comprise at least one selected from silicon oxide, silicon nitride, silicon oxynitride and high-k materials.

A second electrode 265 may be formed on the second interlayer dielectric layer 240 to cover the capacitor dielectric layer 263. The second electrode 265 may comprise a conductive material. For example, the second electrode 265 may comprise at least one selected from a doped semiconductor, a metal, a conductive metal nitride, and a metal silicide.

The first electrode 261, the capacitor dielectric layer 263 and the second electrode 265 may constitute a capacitor. As previously discussed, by using the etch gas comprising the compound represented by Formula 1 or 2, the first to third holes 233, 243 and 253 may be precisely and effectively formed to have a high aspect ratio, respectively. As such, a semiconductor device may be accomplished to have improved reliability and electrical characteristics.

FIGS. 9A to 9H illustrate cross-sectional views of a method for fabricating a semiconductor device according to another exemplary embodiment of the present inventive concept.

Referring to FIG. 9A, a plurality of sacrificial layers 351 and a plurality of insulating layers 310 may be alternately and repeatedly stacked on a substrate 300 to form a thin-film structure TS. The substrate 300 may be, for example, a silicon substrate, a germanium substrate, or a silicon-germanium substrate.

The sacrificial layers 351 may be formed of material having an etch selectivity with respect to the insulating layers 310. In an embodiment, the sacrificial layers 351 may have a high etch selectivity with respect to the insulating layers 310 in a wet etching process using a chemical solution. On the other side, the sacrificial layers 351 may have a low etch selectivity with respect to the insulating layers 310 in a dry etching process previously discussed with reference to FIGS. 1A to 3A and FIGS. 1B to 3B. The insulating layers 310 and the sacrificial layers 351 may respectively correspond to the first etching layer 110 and the second etching layer 120 as previously discussed with reference to FIG. 1B.

In an embodiment, the sacrificial layers 351 may be formed to have the same thickness. Alternatively, uppermost and lowermost ones of the sacrificial layers 351 may have a thickness greater than those of intervening ones of the sacrificial layers 351 therebetween. The insulating layers 310 may have the same thickness. Differently, at least one of the insulating layers 310 may have a different thickness than others of the insulating layers 310.

The sacrificial layers 351 and the insulating layers 310 may be formed by one of thermal CVD, plasma enhanced CVD, physical CVD, and ALD.

In an embodiment, the sacrificial layers 351 and the insulating layers 310 may be formed of insulating material such as silicon oxide, silicon nitride, silicon oxynitride, etc. For example, the sacrificial layers 351 may comprise silicon nitride layers and the insulating layers 310 may comprise silicon oxide layers.

A lower insulating layer 305 may be further formed between the substrate 300 and the thin-film structure TS. For example, the lower insulating layer 306 may be a silicon oxide layer which is formed by a thermal oxidation process or a deposition process. The lower insulating layer 305 may have a thickness less than those of the sacrificial layers 351 and the insulating layers 310.

A first mask pattern HP1 may be formed on the thin-film structure TS. For example, a mask layer may be formed on the thin-film structure TS and then the mask layer may be patterned to form the first mask pattern HP1.

The first mask pattern HP1 may have a plurality of first openings OP1 partially exposing the uppermost insulating layer 310. Each of the first openings OP1 may have a circular shape in a plan view. The first openings OP1 may be arranged in a zigzag fashion in a direction parallel to a top surface of the substrate 300.

Figure 9B:
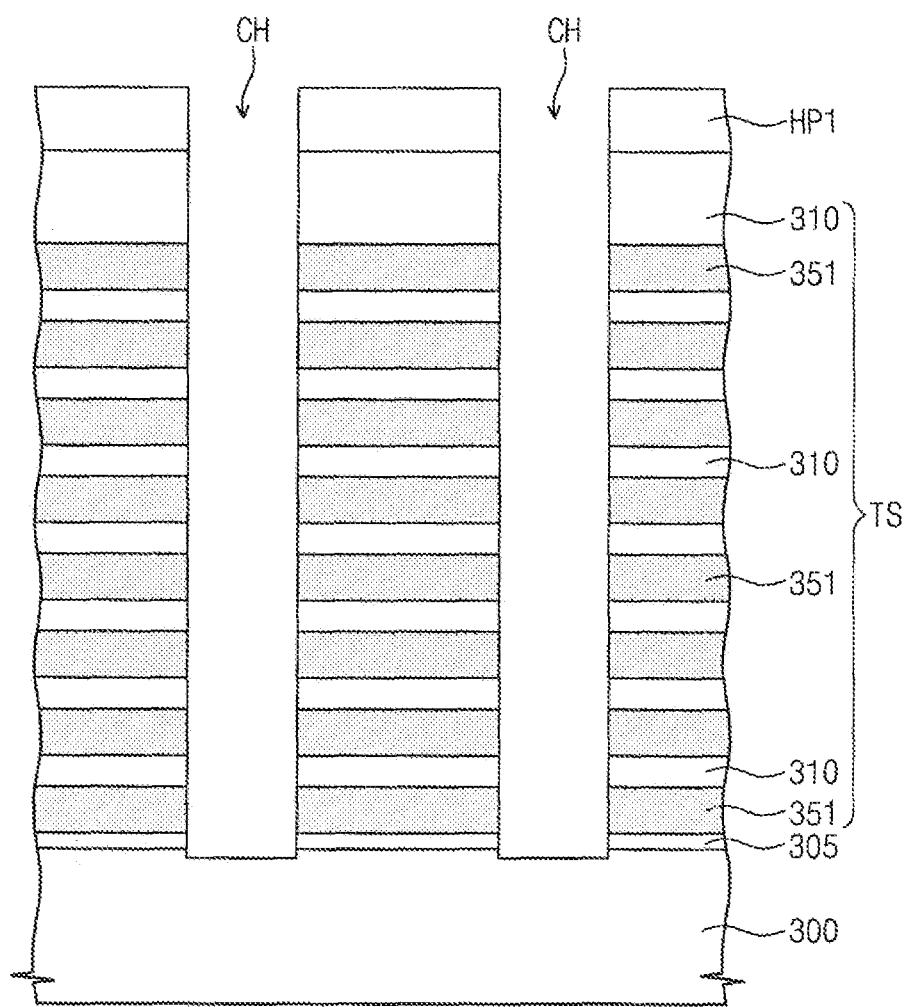

Referring to FIG. 9B, a plurality of channel holes CH may be formed to penetrate the thin-film structure TS and expose the substrate 300. The channel holes CH may be arranged in a zigzag fashion along in the direction parallel to the top surface of the substrate 300.

The sacrificial layers 351 and the insulating layers 310 may be etched using the first mask pattern HP1 as an etch mask to form the channel holes CH. The formation of the channel holes CH may be substantially identical to that of the recess regions RR previously discussed with reference to FIGS. 3A and 3B. For example, the etching process used in the formation of the channel holes CH may be a dry etching process performed under plasma generated from the etching gas comprising the compound represented by Formula 1 or 2.

By using the etching gas according to the present invention, the sacrificial layers 351 and the insulating layers 310 sequentially stacked may be simultaneously etched by a single etching process. Moreover, the channel holes CH may be formed to have a high aspect ratio without bows.

During the etching process for the formation of the channel holes CH, the top surface of the substrate 300 may be over-etched. As a result, the top surface of the substrate 300 may be recessed. After forming the channel holes CH, remaining first mask pattern HP1 may be removed.

Figure 9C:
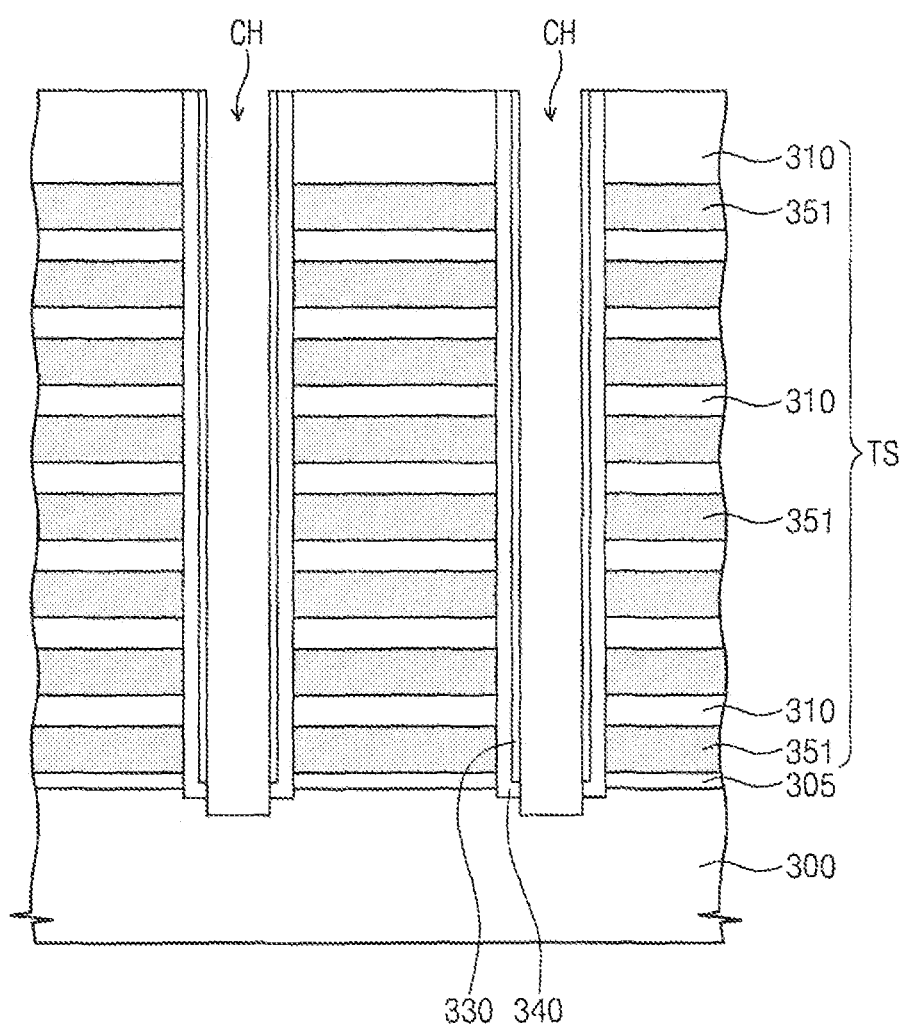

Referring to FIG. 9C, a plurality of vertical insulators 340 and a plurality of first semiconductor patterns 330 may be formed to cover inner walls of the channel holes CH and expose the substrate 300. For example, an insulating layer and a semiconductor layer may be sequentially formed to cover the inner walls of the channel holes CH and then anisotropically etched to form the vertical insulators 340 and the first semiconductor patterns 330. A sum of thicknesses of the vertical insulator 340 and the first semiconductor 330 may be less than half the width of the channel hole CH. As a result, the channel hole CH may not be fully filled with the vertical insulator 340 and the first semiconductor pattern 330. The vertical insulator 340 may partially cover the top surface of the substrate 300 exposed by the channel hole CH. The vertical insulator 340 may comprise a plurality of thin films which are formed by a plasma enhanced CVD, a physical CVD or an ALD.

The vertical insulator 340 may comprise a charge storage layer as a memory element. For example, the charge storage layer may be an insulating layer including a trap nitride layer or a plurality of conductive nanodots. Alternatively, the vertical insulator 340 may comprise a thin layer for a phase change memory or a variable resistance memory.

For example, the vertical insulator 340 may comprise a blocking insulating layer, a charge storage layer and a tunnel insulating layer that are sequentially stacked on one another. The blocking insulating layer may cover sidewalls of the sacrificial layers 351 and the insulating layers 310 exposed by the channel hole CH and further cover the top surface of the substrate 300. The blocking insulating layer may comprise a silicon oxide layer. The charge storage layer may comprise an insulating layer including a trap nitride layer or a plurality of nanodots. For example, the charge storage layer may comprise at least one selected from a silicon nitride layer, a silicon oxynitride layer, a silicon-rich nitride layer, a nanocrystalline silicon layer and a laminated trap layer. The tunnel insulating layer may comprise a material of which band gap is greater than that of the charge storage layer. For example, the tunnel insulating layer may comprise a silicon oxide layer.

The first semiconductor pattern 330 may be formed on the vertical insulator 340. In an embodiment, the first semiconductor pattern 330 may comprise a semiconductor material formed by an ALD or a CVD, for example, a polycrystalline silicon layer, a single crystalline silicon layer, or an amorphous silicon layer.

Each of the vertical insulators 340 and the first semiconductor patterns 330 may be formed to have a hollow cylindrical tube whose top and bottom are open. During the anisotropic etching process for forming the vertical insulator 340 and the first semiconductor pattern 330, the top surface of the substrate 300 may be recessed as a result of an over-etch.

The anisotropic etching process may remove portions of the vertical insulators 340 and the first semiconductor patterns 330 formed on a top surface of the thin-film structure TS, which may expose the top surface of the thin-film structure TS. Therefore, the vertical insulators 340 and the first semiconductor patterns 330 may be locally or restrictedly formed in the channel holes CH.

Figure 9D:
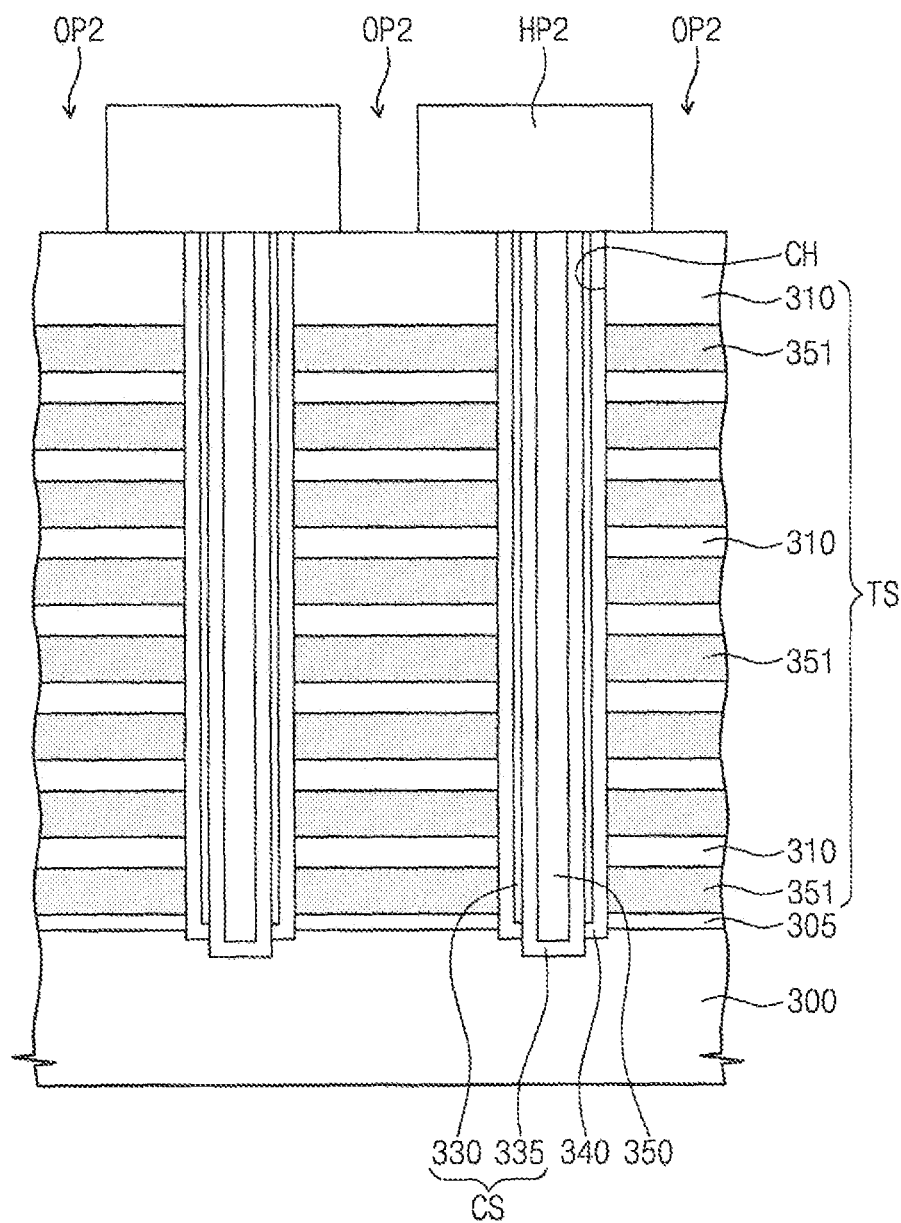

Referring to FIG. 9D, a plurality of second semiconductor patterns 335 and a plurality of vertical insulating patterns 350 may be formed in the channel holes CH. For example, a semiconductor layer and an insulating layer may be sequentially formed on a resultant structure as shown in FIG. 9C and then planarized until the top surface of the thin-film structure TS is exposed, thereby forming the second semiconductor patterns 335 and the vertical insulating patterns 350. The second semiconductor pattern 335 may be conformally formed to have a thickness so as not to completely fill the channel hole CH. The second semiconductor pattern 335 may comprise a semiconductor material formed by an ALD or a CVD, for example, a polycrystalline silicon layer, a single crystalline silicon layer, or an amorphous silicon layer. The vertical insulating pattern 350 may be formed to completely fill the channel hole CH. The vertical insulating pattern 350 may comprise an insulating material formed by a spin-on glass (SOG) method, for example, a silicon oxide layer.

The second semiconductor pattern 335 may be formed in the channel hole CH to have a pipe shape whose one end is closed, a hollow cylindrical shape whose one end is closed, or cup shape. Alternatively, the second semiconductor pattern 335 may be formed to have a pillar shape which fills the channel hole CH. The vertical insulating pattern 350 may be formed to fill an inside of the channel hole CH in which the second semiconductor pattern 335 is formed. The first semiconductor patterns 330 and the second semiconductor patterns 335 may constitute channel structures CS.

A second mask pattern HP2 may be formed on the thin-film structure TS. For example, a mask layer may be formed on the thin-film structure TS and then the mask layer may be patterned to form the second mask pattern HP2.

The second mask pattern HP2 may have a plurality of second openings OP2 partially exposing the uppermost insulating layer 310. The second openings OP2 may have a line shape extending in a direction parallel to the top surface of the substrate 300, in a plan view.

Figure 9E:
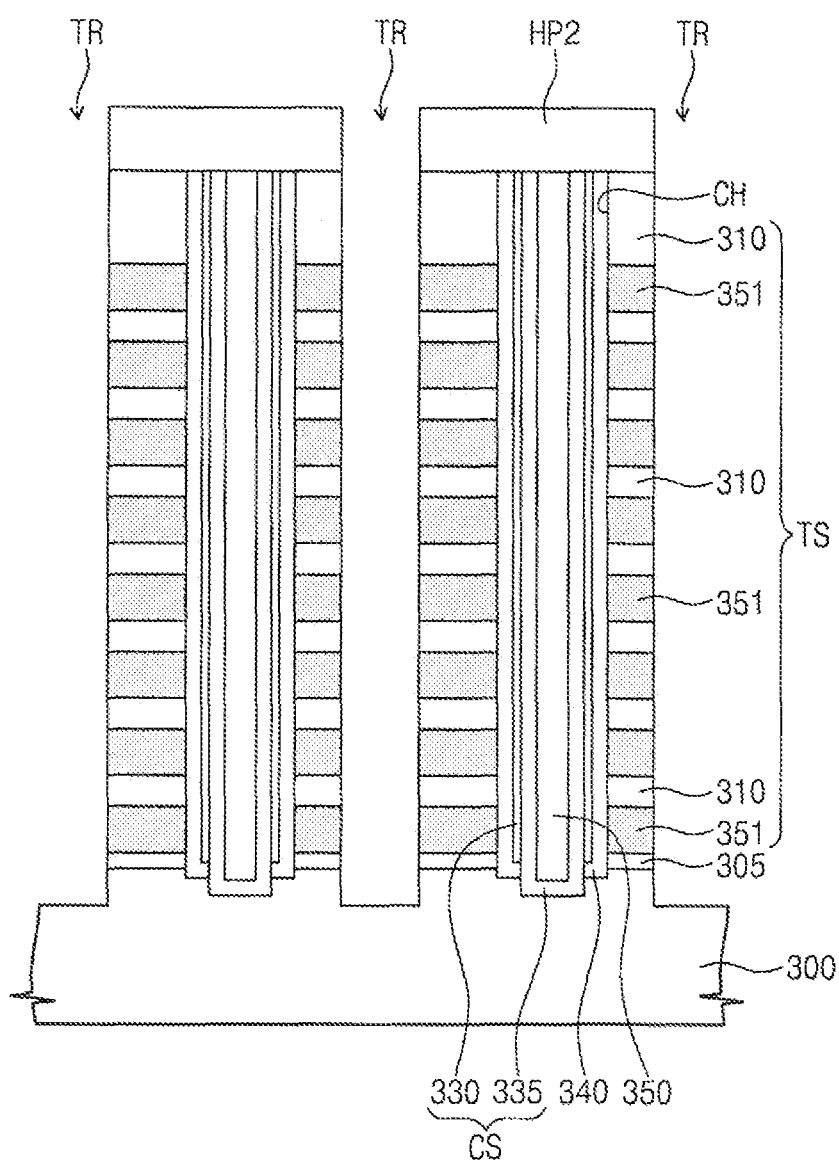

Referring to FIG. 9E, the thin-film structure TS may be patterned to form a plurality of trenches TR exposing the substrate 300. The trenches TR may be formed in the direction parallel to the top surface of the substrate 300, in a plan view and at lateral sides of a row in which the channel holes CH are arranged.

The trenches TR may be formed by etching the sacrificial layers 351 and the insulating layers 310 using the second mask pattern HP2 as an etch mask. The formation of the trenches TR may be substantially identical to that of the recess regions RR previously discussed with reference to FIGS. 3B and 6. For example, the etching process used in the formation of the trenches TR may be a dry etching process performed under plasma generated from the etching gas comprising the compound represented by Formula 1 or 2.

During the etching process for the formation of trenches TR, a top surface of the substrate 300 exposed by the trenches TR may be over-etched. As a result, the top surface of the substrate 300 may be recessed. After forming the trenches TR, the remaining second mask pattern HP2 may be removed.

By using the second mask pattern HP2, a stacking structure may be formed to have a pattern shape corresponding to the second mask pattern HP2 which will be discussed in FIG. 9F.

Figure 9F:
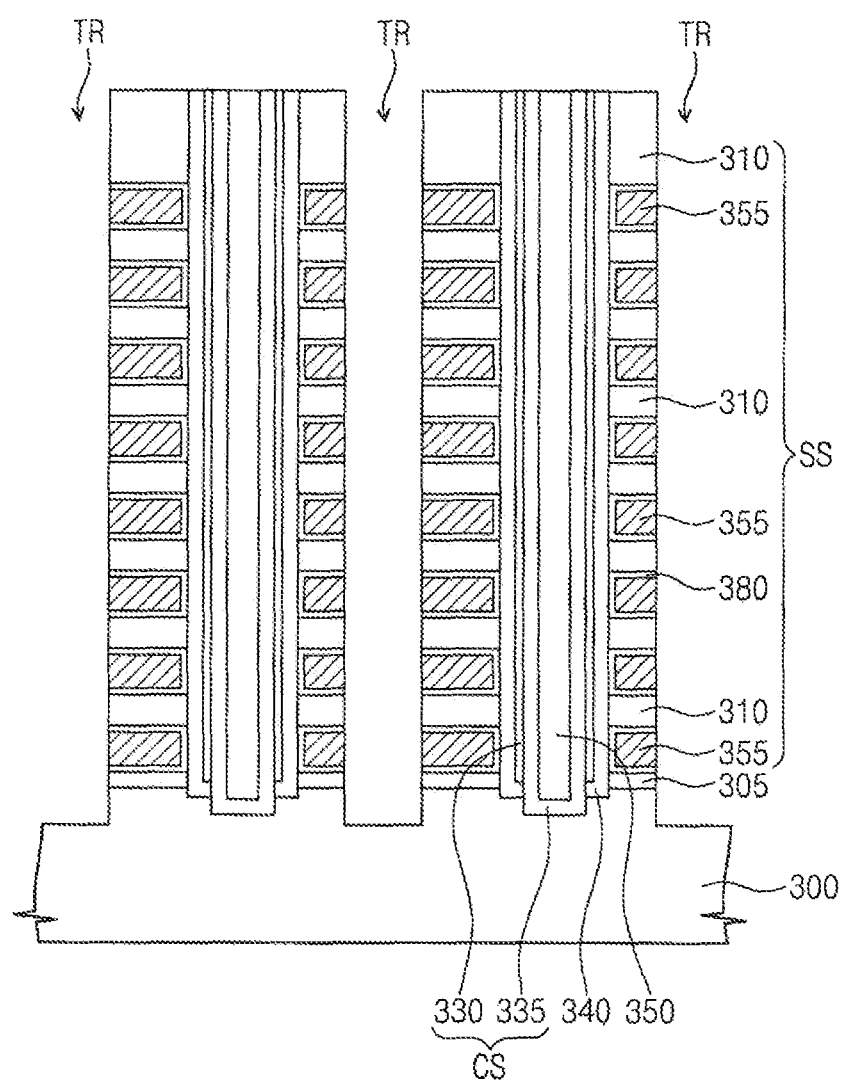

Referring to FIG. 9F, the sacrificial layers 351 exposed by the trenches TR may be selectively removed. The removal of the sacrificial layers 351 may partially expose sidewalls of the vertical insulators 340. A dielectric layer and a gate layer (e.g., a metal layer) may be sequentially formed to fill the areas where the sacrificial layers 351. A plurality of gate dielectric layers 380 may first be formed in areas where the sacrificial layers 351 are removed. A plurality of gate electrodes 355 may then be formed on the gate dielectric layers 380.

The gate electrodes 355 and the insulating layers 310 sequentially stacked on one another may define a stacking structure, or a plurality of stacking structures, SS. The stacking structure, or plurality of stacking structures, SS may have a line shape extending in the direction parallel to the top surface of the substrate 300.

Figure 9G:
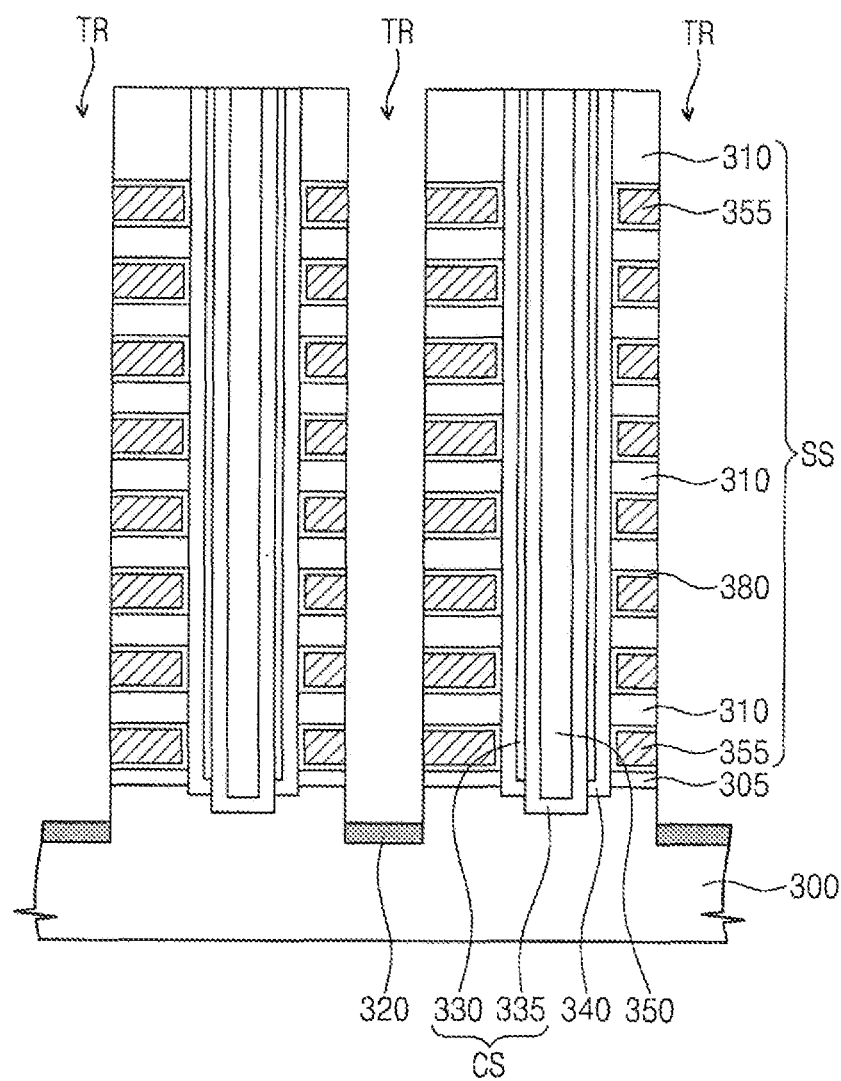

Referring to FIG. 9G, after forming the gate electrodes 355, a plurality of common source regions 320 may be formed on the substrate 300. The common source regions 320 may be formed by an ion implantation onto portions of the substrate 300 exposed through the trenches TR. The common source regions 320 may constitute PN junctions with the substrate 300. In an exemplary embodiment, the common source regions 320 may be connected to each other to have a same electric potential. Alternatively, the common source regions 320 may be electrically divided to have different electric potentials. Differently, the common source regions 320 may constitute a plurality of groups electrically independent from each other, each group having a plurality of common source regions 320 with same electric potential, such that the plurality of groups may be electrically divided to have different electric potentials.

Figure 9H:
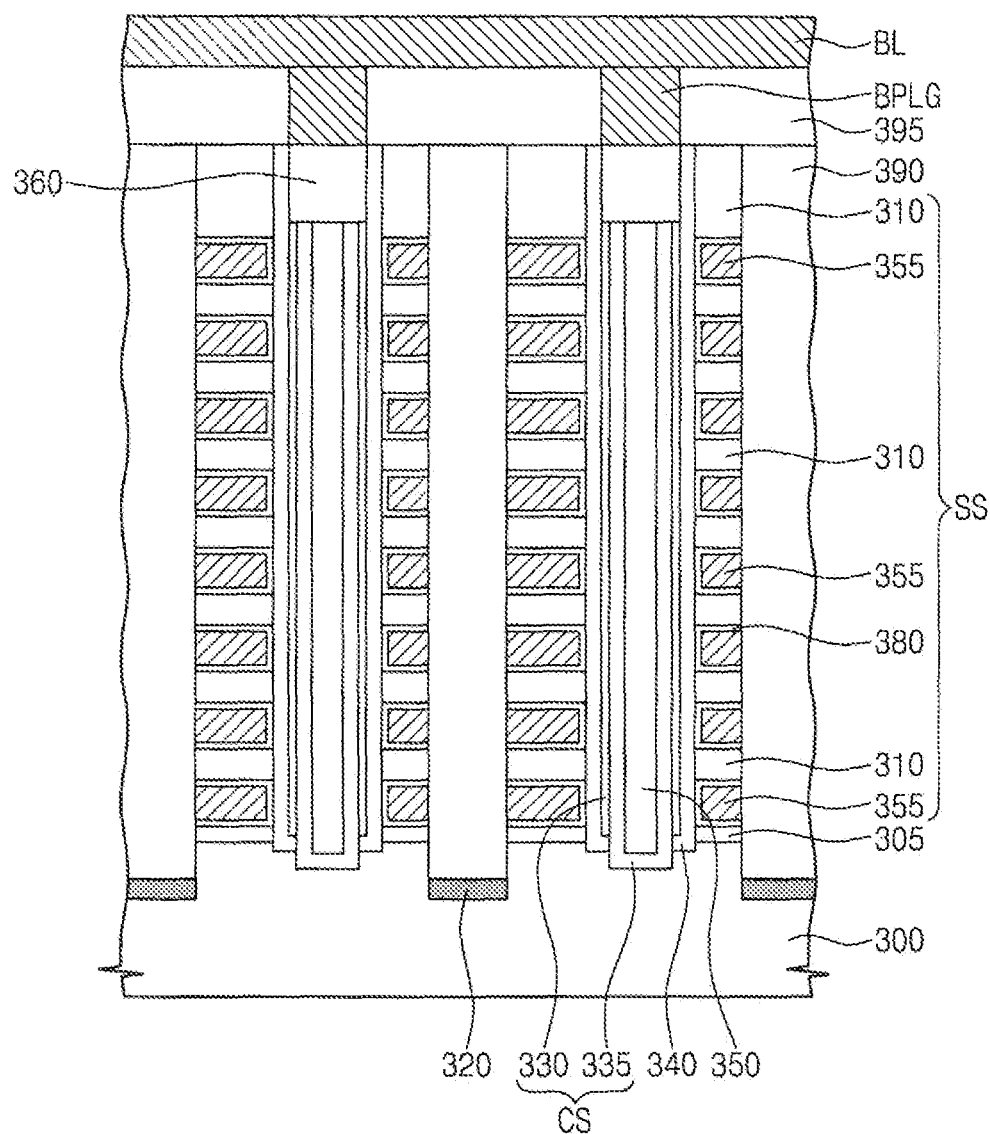

Referring to FIG. 9H, a first interlayer dielectric layer 390 may be formed on the common source regions 320 to cover the stacking structures SS. A plurality of conductive pads 360 may be formed to be coupled to the channel structures CS. For example, upper portions of the channel structures CS may be recessed and then the recessed upper portions of the channel structures CS may be filled with conductor to form the conductive pads 360. Alternatively, the conductive pads 360 may be formed by doping the upper portions of the channel structures CS with impurities having conductive type different from those of the channel structures CS.

A second interlayer dielectric layer 395 may be formed on the first interlayer dielectric layer 390. A plurality of bit line plugs BPLG may be formed to penetrate the second interlayer dielectric layer 395 to be electrically connected to the conductive pads 360. A bit line BL may be formed on the second interlayer dielectric layer 395 to be coupled to the bit line plugs BPLG.

Figure 10:
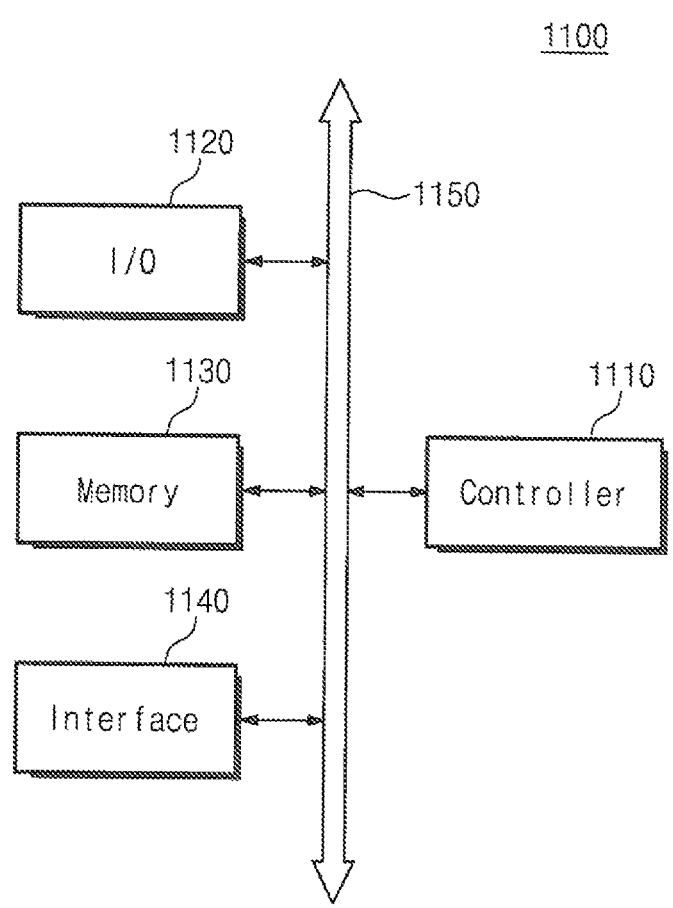
FIG. 10 illustrates a block diagram of electronic devices including a semiconductor device according to an exemplary embodiment of the present inventive concept.

FIG. 10 illustrates a block diagram of an electronic device comprising a semiconductor device provided by and fabricated according to embodiments of the present inventive concept.

Referring to FIG. 10, a memory system 1100 may be used in one of, for example, a personal digital assistant (PDA), a portable computer, a web tablet, a wireless phone, a mobile phone, a digital music player, a memory card, or any device configured to communicate data wirelessly.

The memory system 1100 may comprise a controller 1110, an input/output device 1120 such as a keypad, a keyboard, a display, a memory 1130, an interface 1140, and a bus 1150. The memory 1130 and the interface 1140 may be mutually communicated through the bus 1150.

The controller 1110 may comprise at least one microprocessor, a digital signal process, a microcontroller, or the like. The memory 1130 may be configured to store a command code to be used by the controller 1310. The input/output device 1120 may be configured to receive/transmit data or signal with from/into outside of the memory system 1100. For example, the input/output device 1120 may comprise a keyboard, a keypad, or display.

The controller 1110 or the memory 1130 may comprise a semiconductor device provided by and fabricated according to embodiments of the present inventive concept. The memory 1130 may further comprise one or more memory of various kinds.

The interface 1140 may be configured to transmit data or receive data from a wireless communication network.

Semiconductor devices or memory systems provided by and fabricated according to exemplary embodiments of the present inventive concept may be encapsulated using various and diverse packaging techniques. For example, the semiconductor devices or memory system may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 11:
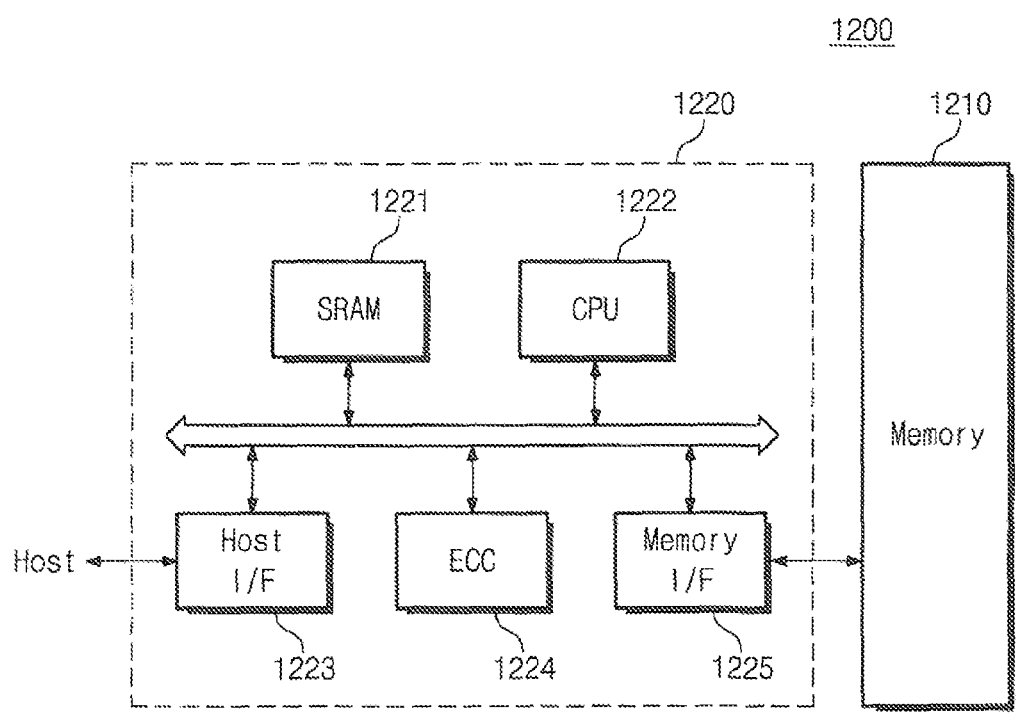
FIG. 11 illustrates a block diagram of a memory card including a semiconductor device according to an exemplary embodiment of the present inventive concept.

FIG. 11 illustrates a block diagram of a memory card comprises a semiconductor device provided by and fabricated according to embodiments of the present inventive concept.

Referring to FIG. 11, a memory device 1210 may be included in a memory card 1200 for high data storage capacity. The memory device 1210 may comprise a semiconductor device provided by and fabricated according to embodiments of the present inventive concept. The memory card 1200 may comprise a memory controller 1220 controlling general data exchanges between a host and the memory device 1210.

A static random access memory (SRAM) 1221 may be used as an operating memory of a processing unit 1222. A host interface 1223 may comprise a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory card 1200 may further comprise a ROM (not shown) that stores code data for interfacing with the host, which is obvious to those skilled in the relevant art.

Figure 12:
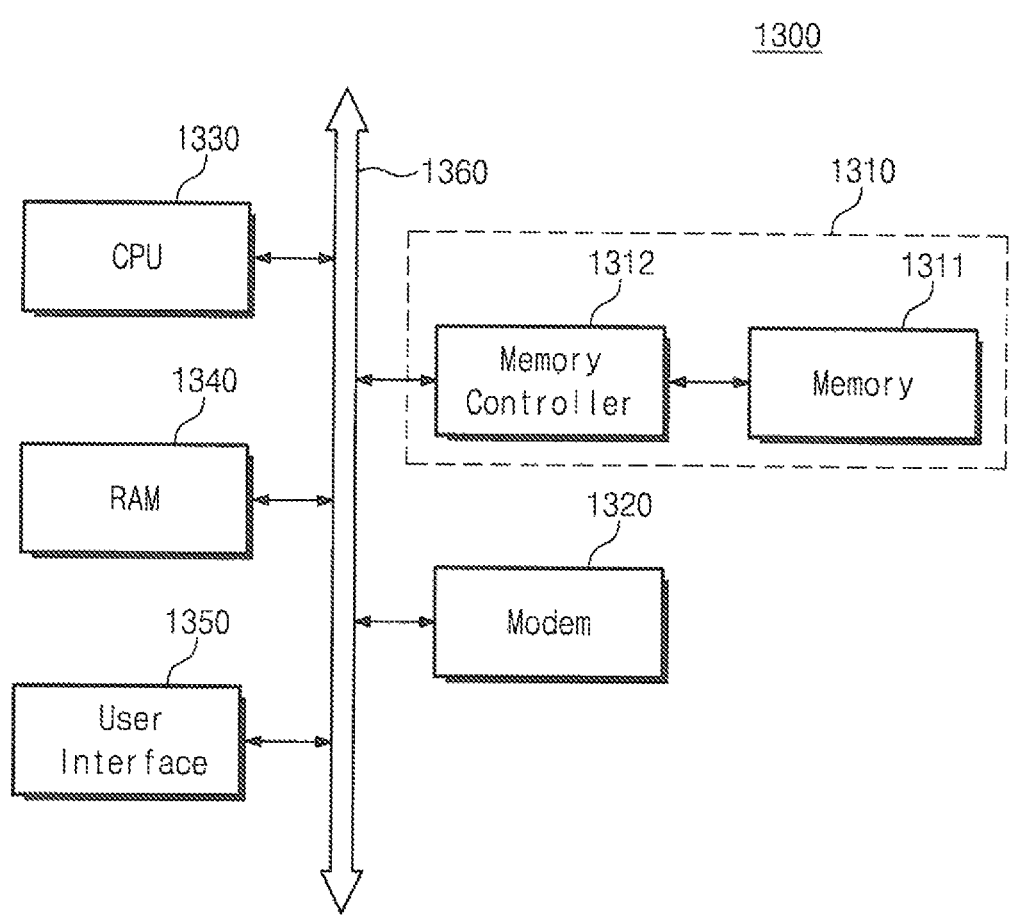
FIG. 12 illustrates a block diagram of an information processing system including a semiconductor device according to an exemplary embodiment of the present inventive concept.

FIG. 12 illustrates a block diagram of an information processing system including a semiconductor device provided by and fabricated according to an embodiment of the present inventive concept.

Referring to FIG. 12, a memory device 1311 may be included in an information processing system 1300 such as a mobile device or a desktop computer. The memory device 1311 may comprise a semiconductor device provided by and fabricated according to embodiments of the present inventive concept. The information processing system 1300 may comprise a modem 1320, a central processing unit (CPU) 1330, a random access memory (RAM) 1340, and a user interface 1350, which are electrically connected to a system bus 1360, in addition to the memory system 1310. The memory system 1310 may be configured substantially identical to the memory system 1100 of FIG. 10. The memory system 1310 may store data processed by the CPU 1330 and/or input from the outside. The memory system 1310 may be used as a portion of a solid state drive (SSD), and in this case, the information processing system 1300 may stably and reliably store a large amount of data in the memory system 1310. The memory system 1310 may reduce resources for the error correction to provide the information processing system 1300 with high speed data transmission. Although not illustrated, it is apparent to those of skill in the art that, for example, an application chipset, a camera image sensor, a camera image processor (CIS), an input/output device, or the like may further be included in the information processing system 1300 comprising semiconductor devices provided by and fabricated according to embodiments of the present inventive concept.

According to other embodiments of the present invention, the multi-stacked layers with different materials can be etched at once. Moreover, the etch profile can be easily controlled under the plasma environment such that it is possible to form a recess with high aspect ratio without defects such as bow.

Although the present invention has been described in connection with the embodiments of the present invention illustrated in the accompanying drawings, it is not limited thereto. It will be apparent to those skilled in the art that various substitutions, modifications and changes may be thereto without departing from the scope and spirit of the invention.

What is claimed is:
1. A method for fabricating a semiconductor device, the method comprising:
    forming a first etching layer and a second etching layer stacked on a substrate; and
    forming a recess region by etching the first and second etching layers under plasma generated from an etching gas comprising a compound represented by Formula 1 or 2,

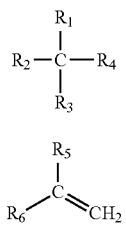

[Formula 1]

[Formula 2]

wherein the first etching layer comprises a material different from that of the second etching layer, wherein $R_1$ is F or $CF_3$, $R_2$ is $CHF_2$, $CH_2F$, I, SH or SOH, and $R_3$ and $R_4$ are independently selected from H, F or $CHF_2$, and wherein $R_5$ is F or $CF_3$ and $R_6$ is F, $CHF_2$ or $CH_2F$.

2. The method of claim 1, wherein the first and second etching layers are etched by a single process with plasma generated from the etching gas.

3. The method of claim 1, wherein the first etching layer comprises a silicon oxide layer and the second etching layer comprises one of a silicon nitride layer and a silicon oxynitride layer.

4. The method of claim 1, wherein the compound represented by Formula 1 comprises at least one of 1,1,1,2,3,3-hexafluoropropane, 2,2,2-trifluoroethane-1-thiol, 1,1,1,3,3-pentafluoropropane, 1,1,2,2,3-pentafluoropropane and 1,1,2,2-tetrafluoro-1-iodoethane, and wherein the compound represented by Formula 2 comprises at least one of 2,3,3,3-tetrafluoropropene and 1,1-difluoroethene.

5. The method of claim 1, wherein the plasma generated from the etching gas provides a first active species, a second active species and a third active species, wherein:

the first active species comprises at least one selected from the group consisting of $CF_3^+$, $CF_2^+$ and $CF^+$;

the second active species comprises at least one selected from $CHF_2^+$ or $CH_2F^+$; and the third reactive species comprises at least one selected from the group consisting of $C_xF_y$, S, SO and I.

6. The method of claim 5, wherein the third active species comprises $C_xF_y$ with a ratio of x to y (x:y) of 1 or more.

7. The method of claim 1, wherein the etching gas further comprises at least one compound selected from the group consisting of $C_4F_8$, $C_4F_6$ and $O_2$.

8. The method of claim 1, wherein the etching gas comprises least two compounds represented by Formula 1 or 2.

9. The method of claim 1, wherein the etching is performed under a pressure of 1 mTorr to 200 mTorr at a temperature of 25° C. to 200° C.

10. The method of claim 1, wherein the recess region has an aspect ratio of 5 to 150.

11. The method of claim 1, wherein the recess region comprises a hole extending a direction perpendicular to a top surface of the substrate or a trench extending a direction parallel to the top surface of the substrate.

12. The method of claim 1, wherein before forming the recess region, the method further comprises forming a mask pattern on the first and second etching layers, the mask pattern including an opening to define a plan shape of the recess region, and wherein the etching gas selectively etches the first and second etching layers.

13. The method of claim 1, wherein forming the first and second etching layers comprises stacking sacrificial layers and insulating layers alternately and repeatedly on the substrate to form a thin-film structure, wherein the recess region comprises a channel hole penetrating the thin-film structure to expose the substrate.

14. The method of claim 1, wherein forming the first and second etching layers comprises stacking sacrificial layers and insulating layers alternately and repeatedly on the substrate to form a thin-film structure, wherein the recess region comprises a trench penetrating the thin-film structure to expose the substrate and extending in a direction parallel to a top surface of the substrate.

15. A method for fabricating a semiconductor device, the method comprising:

forming an etching layer on a substrate; and forming a recess region by etching the etching layer under plasma generated from an etching gas including a compound represented by Formula 1,

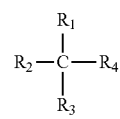

[Formula 1]

wherein $R_1$ is F or $CF_3$, $R_2$ is I, SH or SOH, $R_3$ and $R_4$ are independently selected from H, F or $CHF_2$.

16. The method of claim 15, wherein the etching layer comprises a first etching layer and a second etching layer sequentially stacked on the substrate, the first etching layer including a silicon oxide layer and the second etching layer including one of a silicon nitride layer and a silicon oxynitride layer.

17. The method of claim 15, wherein the etching gas further comprises at least one compound selected from the group consisting of $C_4F_8$, $C_4F_6$ and $O_2$.

18. The method of claim 15, wherein the etching gas further comprises $O_2$, wherein $O_2$ is present at a mole fraction of $O_2$ ranging from 0.5 to 1.0 based on the compound represented by Formula 1.

19. The method of claim 15, wherein the compound represented by Formula 1 comprises at least one of 2,2,2-trifluoroethane-1-thiol and 1,1,2,2-tetrafluoro-1-iodoethane.

20. A method for fabricating a semiconductor device, the method comprising:

providing a substrate comprising a device isolation pattern, wherein the device isolation pattern defines an active region;

forming a gate electrode in the substrate to cross the active region;

forming first and second impurity regions adjacent to both sides of the gate electrode, respectively, and in the active region;

forming a first insulating layer and a second insulating layer stacked on the active region, the second insulating layer comprising a material different from that of the first insulating layer; and forming a contact hole by etching the first and second insulating layers in a single process with plasma generated from an etching gas comprising a compound represented by Formula 1 or 2,

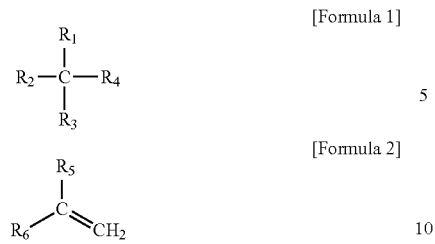
[Formula 1]
[Formula 2]
wherein $R_1$ is F or $CF_3$, $R_2$ is $CHF_2$, $CH_2F$, I, SH or SOH, and $R_3$ and $R_4$ are independently selected from H, F or $CHF_2$, and
wherein $R_5$ is F or $CF_3$ and $R_6$ is F, $CHF_2$ or $CH_2F$.
* * * * *